United States Patent
Wohl et al.

(10) Patent No.: US 9,152,752 B2
(45) Date of Patent: *Oct. 6, 2015

(54) INCREASING PRPG-BASED COMPRESSION BY DELAYED JUSTIFICATION

(71) Applicant: Synopsys, Inc., Mountain View, CA (US)

(72) Inventors: Peter Wohl, Williston, VT (US); John A. Waicukauski, Tualatin, OR (US)

(73) Assignee: Synopsys, Inc., Mountain View, CA (US)

( * ) Notice: Subject to any disclaimer, the term of this patent is extended or adjusted under 35 U.S.C. 154(b) by 273 days.

This patent is subject to a terminal disclaimer.

(21) Appl. No.: 13/840,602

(22) Filed: Mar. 15, 2013

(65) Prior Publication Data

US 2013/0232458 A1    Sep. 5, 2013

Related U.S. Application Data

(63) Continuation of application No. 12/969,429, filed on Dec. 15, 2010, now Pat. No. 8,429,473.

(60) Provisional application No. 61/314,550, filed on Mar. 16, 2010.

(51) Int. Cl.
| G06F 11/00 | (2006.01) |
| G06F 17/50 | (2006.01) |
| G01R 31/3185 | (2006.01) |

(52) U.S. Cl.
CPC ...... *G06F 17/505* (2013.01); *G01R 31/318547* (2013.01)

(58) Field of Classification Search
CPC .................................................. G06F 11/623
See application file for complete search history.

(56) References Cited

U.S. PATENT DOCUMENTS

| 5,383,143 | A | 1/1995 | Crouch et al. |
| 6,061,818 | A * | 5/2000 | Touba et al. .................. 714/739 |
| 6,684,358 | B1 * | 1/2004 | Rajski et al. .................. 714/739 |
| 6,950,974 | B1 | 9/2005 | Wohl et al. |
| 7,093,175 | B2 | 8/2006 | Rajski et al. |
| 7,237,162 | B1 | 6/2007 | Wohl et al. |
| 7,979,763 | B2 | 7/2011 | Wohl et al. |
| 2005/0081130 | A1 * | 4/2005 | Rinderknecht et al. ....... 714/726 |

(Continued)

OTHER PUBLICATIONS

Vermeulen et al. "Trends in testing integrated circuits," International Test Conference, 2004, pp. 688-697.

(Continued)

*Primary Examiner* — Christopher McCarthy

(74) *Attorney, Agent, or Firm* — Bever, Hoffman & Harms, LLP

(57) ABSTRACT

An improved compression technique can increase PRPG-based compression by modifying test generation so that justification of certain decision nodes, called xheadlines, is delayed and merged with PRPG seed computation. Xheadlines are defined by gate modification restrictions, dynamic value considerations, and fanout allowance. Before mapping, the xheadlines can be preprocessed. This preprocessing can include transforming XOR xheadlines having shared inputs, augmenting AND/OR xheadlines, and reducing AND/OR xheadlines with common inputs. Mapping can include determining which xheadlines are satisfied by a current seed, which xheadlines can be satisfied by a future seed, and which xheadlines can opportunistically be satisfied by the current seed.

22 Claims, 24 Drawing Sheets

(56) References Cited

U.S. PATENT DOCUMENTS

| | | |
|---|---|---|
| 2007/0168816 A1 | 7/2007 | Hiraide et al. |
| 2010/0100781 A1* | 4/2010 | Wohl et al. .................... 714/728 |
| 2011/0258503 A1 | 10/2011 | Wohl et al. |

OTHER PUBLICATIONS

Ferhani et al. "Classifying bad chips and ordering test sets," International Test Conference, 2006, 10 pgs.

Keller et al. "An economic analysis and ROI model for nanometer test." International Test Conference, 2004, pp. 518-524.

Hamzaoglu et al. "Reducing Test Application Time for Full Scan Embedded Cores," Proc. Int. Symp. on Fault-Tolerant Computing, 1999, 8 pgs.

Wohl et al. "Minimizing the Impact of Scan Compression," VLSI Test Symposium, 2007, 8 pgs.

Mitra et al. "XPAND: An Efficient Test Stimulus Compression Technique," IEEE Trans. on Computers, vol. 55, No. 2, Feb. 2006, pp. 163-173.

Dutta et al. "Using Limited Dependence Sequential Expansion for Decompressing Test Vectors," International Test Conference, 2006, 9 pgs.

McCluskey et al. "Test data compression," IEEE Design & Test of Computers, 2003, vol. 20, No. 2, pp. 76-87.

Konemann, B. "LFSR-Coded Test Patterns for Scan Designs," European Test Conference, Munich, 1991, 7 pgs.

Rajski et al. "Embedded Deterministic Test for Low Cost Manufacturing Test," International Test Conference, 2002, pp. 301-310.

Wohl et al. "Fully X-tolerant, Very High Scan Compression," Design Automation Conference, 2010, 6 pgs.

Lai et al. "A Reseeding Technique for LFSR-Based BIST Applications," Asian Test Symposium, 2002, pp. 200-205.

Al-Yamani et al. "Seed Encoding with LFSRs and Cellular Automata," Design Automation Conference, 2003, pp. 560-565.

Balakrishnan et al. "Relationship Between Entropy and Test Data Compression," IEEE Transactions on Computer-Aided Design of Integrated Circuits and Systems, 2007, vol. 26, No. 2, pp. 386-395.

Balakrishnan et al. "Improving Linear Test Data Compression," IEEE Trans. on VLSI Systems, vol. 14, No. 11, Nov. 2006, pp. 1227-1237.

Balakrishnan et al. "Reconfigurable Linear Decompressors Using Symbolic Gaussian Elimination," Design and Test Europe, 2005, 6 pgs.

Hellebrand et al. "Built-In Test for Circuits with Scan Based on Reseeding of Multiple-Polynomial Linear Feedback Shift Registers," IEEE Transactions on Computers, vol. 44, No. 2, Feb. 1995, pp. 223-233.

Hellebrand et al. "Generation of Vector Patterns through Reseeding of Multiple-Polynomial Linear Feedback Shift Registers," International Test Conference, 1992, pp. 120-129.

Krishna et al. "Test Vector Encoding Using Partial LFSR Reseeding," International Test Conference, 2001, pp. 885-893.

Kim et al. "Inceasing Encoding Efficiency of LFSR Reseeding-Based Test Compession" IEEE Transactons on Computer-Aided Design of Integrated Circuits and Systems, vol. 25, No. 5, May 2006, pp. 913-917.

Krishna et al. "Reducing Test Data Volume Using LFSR Reseeding with Seed Compression," International Test Conference, 2002, pp. 321-330.

Lee et al. "Combining Linear and Non-Linear Test Vector Compression Using Correlation-Based Rectangular Encoding," VLSI Test Symposium, 2006, 6 pgs.

Mrugalski et al. "Comprssion Based on Deterministic Vector Clustering of Incompatible Test Cubes," Interntonal Test Conference, 2009, 10 pgs.

Fujiwara et al. "On the Acceleration of Test Generation Algorithms," IEEE Trans. on Computers, vol. C-32, No. 12, Dec. 1983, pp. 1137-1144.

Fritzemeier et al. "Fundamentals of Testability—A Tutorial," IEEE Trans. on Industrial Electronics, vol. 36, No. 2, May 1989, pp. 117-128.

Konijnenburg et al. "Compact Test Sets for Industrial Circuits," VLSI Test Symposium, 1995, pp. 358-366.

Wohl et al. "Efficient Compression of Deterministic Patterns into Multiple PRPG Seeds," International Test Conference, 2005, 10 pgs.

* cited by examiner $$\begin{bmatrix} 1 & 0 & 1 & 0 & 0 \\ 1 & 1 & 0 & 1 & 0 \end{bmatrix} \rightarrow \begin{bmatrix} 1 & 0 & 1 & 0 & 0 \\ 0 & 1 & 1 & 1 & 0 \end{bmatrix}$$

701    702

Adding
xheadline-based
extra equations
technique
1400

1401

For all AND/OR xheadlines with highest input in the shift window,
for all inputs i,
add equation setting input i to controlling value, solve system of equations,
use current seed for "failed" xheadlines

1402
For all other AND/OR xheadlines in the shift window,
for all inputs i,
add equation setting input i to controlling value, solve system of equations,
use future seed for "failed" xheadlines

FIG. 14

INCREASING PRPG-BASED COMPRESSION BY DELAYED JUSTIFICATION

RELATED APPLICATIONS

This application is a continuation of U.S. patent application Ser. No. 12/969,429, entitled "Increasing PRPG-based Compression by Delayed Justification" filed Dec. 15, 2010 and claims priority of U.S. Provisional Patent Application 61/314,550, entitled "Increasing PRPG-Based Compression By Delayed Justification" filed Mar. 16, 2010.

BACKGROUND OF THE INVENTION

1. Field of the Invention

The present invention relates to pseudo-random pattern generators (PRPGs) and in particular to increasing PRPG-based compression by modifying test generation so that a justification of certain decision nodes is delayed and merged with PRPG seed computation.

2. Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if the longest scan chain includes 500 scan cells, then at least 500 clock cycles are used to complete the loading process. Note that, in actual embodiments, software can compensate for different scan chain lengths, thereby ensuring that outputs from each test pattern are recognized and analyzed accordingly.

The test patterns for the scan chains can be generated using an external testing device. Using such a device, an exhaustive test can be done by applying $2^N$ input patterns to a design with N inputs and scan cells, wherein N is a positive integer. However, this test approach is commercially impractical as the number of inputs increases.

To solve this problem, deterministic automatic test pattern generation (ATPG) can be used to generate a smaller set of patterns while providing fault coverage close to 100%. Specifically, in deterministic ATPG, each test pattern is designed to test for as many faults as possible. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design that allow the IC to quickly test itself. These built-in self-test (BIST) structures can include various pattern generators, the most typical being a pseudorandom pattern generator (PRPG). After the patterns generated by the PRPG are propagated through the scan chains in the tested design, the outputs are analyzed to determine if a fault is detected. An exemplary scan test system and technique using PRPG is described in U.S. Pat. No. 7,237,162, entitled "Deterministic BIST Architecture Tolerant Of Uncertain Scan Chain Outputs", which issued on Jun. 26, 2007 and is incorporated by reference herein.

To achieve high defect coverage during IC scan testing, particularly in light of shrinking process technologies and new IC materials, different fault models (e.g. stuck-at, transition delay, and shorts/opens models) may be used. Unfortunately, although test patterns for timing dependent and sequence dependent fault models are increasingly important for new technologies, such test patterns can require 2-5 times more tester time and data. Current increases in test data volume and test application time are projected to continue for at least an order of magnitude for next generation tools. Therefore, scan-alone scan testing has become insufficient as a method to control test costs. Even highly compacted vector sets generated with modern ATPG require on-chip compression and decompression to reduce test cost.

Scan compression lowers test cost by reducing test pattern volume, test application time, and tester pin count requirements. Techniques described below can advantageously increase scan input data compression while maintaining test coverage, test diagnosis, and hardware support.

SUMMARY OF THE INVENTION

A method of generating pseudo-random pattern generator (PRPG) seeds to increase scan compression is provided. In this method, xheadlines for a circuit design can be generated. These xheadlines are decision nodes resulting from gate modification restrictions, dynamic value considerations, and fanout allowance. After preprocessing the xheadlines, the xheadlines and any care bits (generated for non-xheadlines) can be mapped to PRPG seeds.

Gate modification restrictions can include limiting the xheadlines to AND, OR, and XOR gates (or their inverted versions). Dynamic value considerations can include identifying xheadlines dynamically based on current values already justified during test generation. Fanout allowance can include allowing fanout in a fanin cone of each xheadline.

Preprocessing can include transforming XOR xheadlines having shared inputs. This transforming can include creating a system of linear equations and performing Gaussian elimination on the system of linear equations.

Preprocessing can also include augmenting AND or OR xheadlines. This augmenting can include determining the highest shift cycle input, and creating subsets of xheadlines sharing the highest shift cycle input. Note that the subsets are disjoint. Terms can be added based on the type of xheadline to ensure that all xheadlines in a subset are satisfied whether the highest shift cycle input is set to 0 or 1. Then, each disjunction can be transformed into a conjunction, wherein each term of the conjunction is a new generated xheadline. At this point, an incremental solution can be computed based on the conjunction. In one embodiment, augmenting can further include repeatedly checking for newly generated shared inputs.

Preprocessing can also include reducing AND or OR xheadlines with common inputs. To perform this reduction, a first counter and a second counter for each input can be provided. The first counter represents a controlling value of "0" and the second counter represents a controlling value of "1". Values of the first and second counters can be set based on number of shared inputs. Then, an input with the highest counter value can be determined. When the highest counter value exceeds a threshold, that input can be set to its corresponding controlling value (i.e. an assigned value). At this point, certain xheadlines can be eliminated based on values of their associated counters and a new 1-input xheadline can be generated to represent the assigned value.

Mapping can include sorting of care bits by shift position so that PRPG seeds can be incrementally generated, starting with the first shift, whereby each seed is computed to satisfy conditions for as many shifts as possible. Mapping can also include estimating the number of xheadline bits per shift. A window of shifts can be computed using the sorted care bits and the estimated xheadline bits. Linear equations can be set up for the care bits as well as the XOR and 1-input AND/OR xheadlines with highest input in the window. These linear equations can then be solved, leaving don't care bits unassigned. When solving fails, the size of the window can be reduced. At this point, setting up and solving equations for the care bits as well as the XOR and 1-input AND/OR xheadlines can be repeated using the smaller window. When solving is successful, extra xheadline equations can be added. This adding can determine which xheadlines are satisfied by a current seed, which xheadlines can be satisfied by a future seed, and which xheadlines can opportunistically be satisfied by the current seed.

Because justification of xheadlines can be delayed until PRPG seed computation, scan compression can be significantly increased. This delayed justification technique does not affect test coverage or diagnosis, requires no hardware support, and can be applied to any linear compression scheme.

BRIEF DESCRIPTION OF THE DRAWINGS

FIG. 14 illustrates a technique for adding extra xheadline equations and determining whether specific AND/OR xheadlines are to be mapped to the current seed or a future seed.

DETAILED DESCRIPTION OF THE DRAWINGS

Scan testing and scan compression have become key components for reducing test cost. High-compression schemes typically use pseudo-random pattern generators (PRPGs). As described in further detail below, an improved compression technique can increase PRPG-based compression by modifying test generation so that justification of certain decision nodes is delayed and merged with PRPG seed computation.

Scan load compression techniques exploit the scarcity of "care" bits (i.e. values stored in predetermined scan cells that can achieve detection of targeted faults) in scan input data compared to the "don't care" bits (i.e. those bits that do not indicate faults in the tested design). Scan unload compression techniques exploit the fact that error values appear more or less randomly, and only on a few scan chains at a time. Specifically, the tested design can occasionally output uncertain bits in addition to care bits and don't care bits. As the name implies, an uncertain bit (called an "X" herein) has a value that is unknown (i.e. a value that cannot be accurately predicted by the simulation used during the ATPG process). As a result, X bits can corrupt the analysis of the scan outputs. Moreover, such X bits can limit unload compression by masking observation, and can also limit load compression by requiring additional care bits to prevent Xs or avoid their effect on scan outputs.

Figure 1:
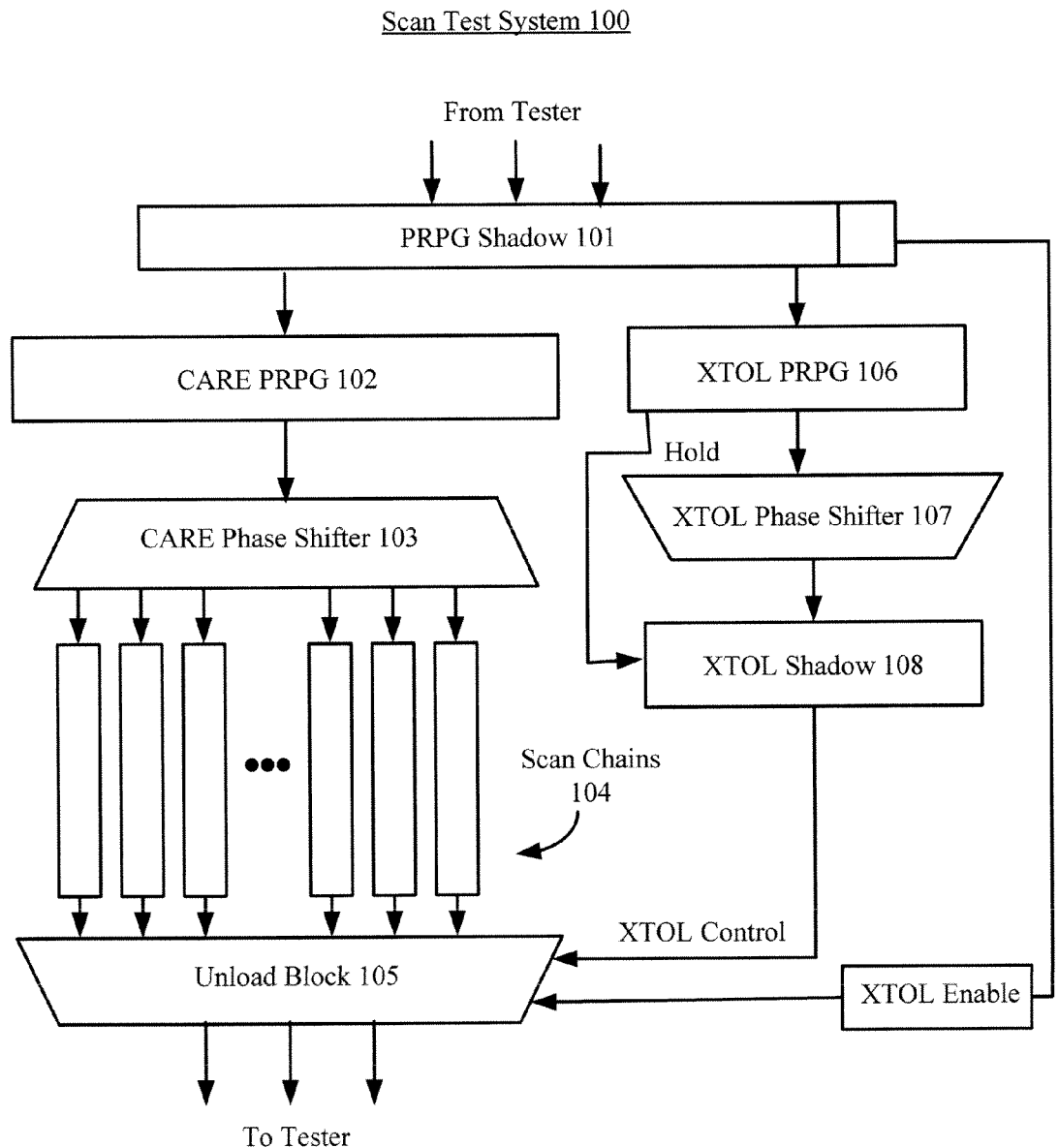
FIG. 1 illustrates an exemplary scan test system with PRPG-based compression that can use the delayed justification technique to increase scan compression.

FIG. 1 illustrates an exemplary scan test system with PRPG-based compression 100 that can use the delayed justification technique described below. In scan test system 100, dual PRPGs can be used to provide a per-shift control of the X-tolerant bits while avoiding conflicts with load care bits. To provide this optimization, a care bit PRPG (CARE PRPG) 102 can produce care (and don't care) bits and a separate X-tolerant PRPG (XTOL PRPG) 106 can produce XTOL control bits. Note that a PRPG shadow register 101 can receive seeds from a tester and generate appropriate seeds for either of CARE PRPG 202 or XTOL PRPG 206. U.S. patent application Ser. No. 12/363,520, entitled "Fully X-Tolerant, Very High Scan Compression Scan Test Systems And Techniques", filed on Jan. 30, 2009, and incorporated by reference herein, describes PRPG shadow register 101 and other components of scan test system 100 in greater detail. CARE PRPG 102 can provide its output to a CARE phase shifter 103, which can have more outputs than inputs. Thus, in combination, CARE PRPG 102 and CARE phase shifter 103 can provide load decompression for the care (and don't care) bits.

Note that a PRPG is effectively a shift register with a predetermined feedback configuration. Therefore, adjacent cells of the PRPG have a dependency on one another, i.e. a second cell that is downstream of a first cell can store a value that was previously stored by the first cell one clock before. Phase shifters, which are typically implemented using XOR gates that receive inputs from predetermined cells, reduce the linear dependency between adjacent cells of the PRPG so that fault detection is minimally deterred by the linear dependencies of the PRPG. The various configurations of a PRPG and a phase shifter are known to those skilled in the art of IC testing and therefore are not explained in detail herein.

In one embodiment, PRPG shadow register 101 can provide an XTOL enable bit (which can be stored in a one-bit register) to turn off XTOL tolerance in an unload block 105. Turning off the enable bit can reduce compressed data volume by not requiring XTOL PRPG bits for a window of adjacent shift cycles that need no X control. XTOL PRPG 106 continues to shift, but its control over unload block 105 can be disabled by the XTOL enable signal. When enabled, XTOL PRPG 106 can provide per-shift X-control to unload block 105.

In one embodiment, the XTOL enable bit can be changed only when either CARE PRPG 102 or XTOL PRPG 106 is reseeded. Therefore, the XTOL Enable bit can significantly reduce XTOL bits for designs with very low X densities, but provides relatively coarse control. To further reduce XTOL bits for medium and high X densities, a finer control can also be provided. Notably, X distribution is highly uneven in most designs, thereby allowing the XTOL control bits to be re-used for adjacent cycles (and the pattern as generated by ATPG can be tuned to favor re-use). Therefore, in accordance with one embodiment, a dedicated channel of XTOL PRPG 106 can provide a Hold bit to XTOL shadow register 108. This Hold bit ensures that the XTOL PRPG data in XTOL shadow register 108 is kept unchanged.

Note that while XTOL shadow register 108 provides constant XTOL control bits to unload compressor 105, XTOL PRPG 106 can advance to the next state when a new set of XTOL control bits is needed. In one embodiment, a single bit per shift is needed from XTOL phase shifter 107 to control XTOL shadow register 108.

As described above, XTOL phase shifter 107 advantageously has fewer outputs than inputs. Therefore, placing XTOL shadow register 108 on the output of XTOL phase shifter 107 (rather than on the output of XTOL PRPG 106) results in a much smaller shadow register. In one embodiment, the number of XTOL-control bits is about log(# scan chains). Also, the long combinational path from XTOL PRPG 106 to unload block 105 is greatly reduced by placing XTOL shadow register 108 after XTOL phase shifter 107.

By using XTOL PRPG 106, scan test system 100 can ensure that no X's propagate to the MISR (multiple-input shift register), which forms part of unload block 105. Thus, the scan cells selected to capture targeted fault effects (and any other non-X cells as practicable) can be efficiently observed in the MISR.

Although ATPG tools are very efficient in merging multiple faults into a single test pattern (i.e. seed), only a small percentage of bits are actually care bits. In conventional scan testing, inputs other than care bits are assigned random values and then the entire test vector is loaded onto the tester. Compression techniques typically store only the care bits and fill-in the other bits through on-chip decompression hardware when the test is applied.

A variety of techniques have been developed based on exploiting the low density of care bits in scan input data. Load compression techniques are commonly classified as combinational or sequential, based on the decompressor hardware.

Simple, combinational decompressors (such as Illinois scan, which use a simple fanout network, and MUX networks) can incorporate the constraints imposed by the decompressor logic into the conditions that must be satisfied by the test generator for fault detection. Thus, each test cube produced is mapped directly to the decompressor inputs. With more complex combinational decompressors (e.g. XOR-based decompressors), ATPG first generates a test cube (i.e. a full set of test vectors), independent of decompressor constraints. This test cube can then be mapped to the decompressor inputs by solving a system of linear equations.

Limited sequential decompressors can incorporate decompressor constraints in the ATPG search space. Fully sequential decompressors based on PRPGs rarely include the constraints in the ATPG search space because of significant increases in search complexity, which would render test generation ineffective.

Notably, a full test cube, which is typically mapped to seeds, is not generated in a delayed justification technique. In the delayed justification technique, certain justification decisions are delayed by forming xheadlines (described in detail below). These xheadlines can then be mapped with regular care bits to PRPG seeds. Because xheadlines minimize generating care bits in the test cube, increased compression can be achieved by using the delayed justification technique.

Figure 2:
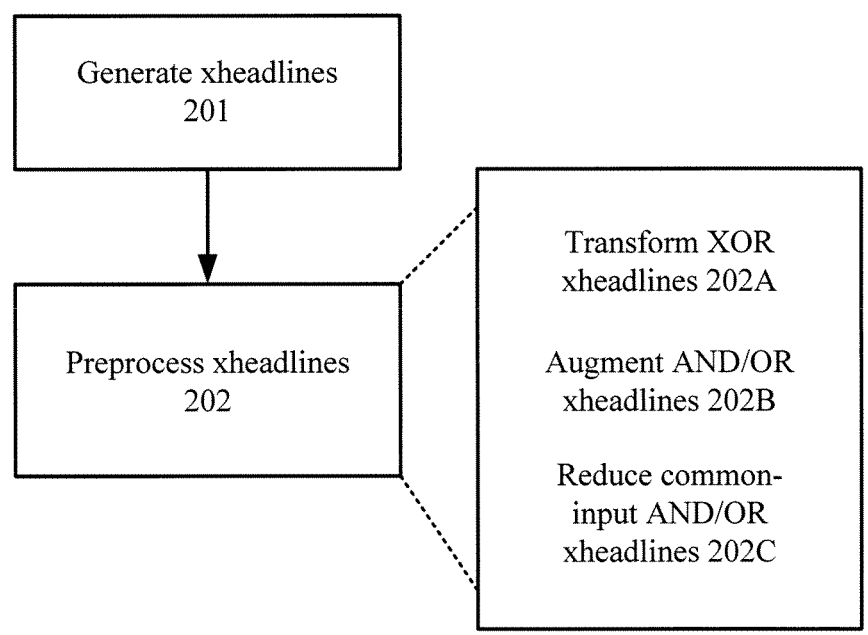
FIG. 2 illustrates an exemplary xheadline generation and preprocessing technique, which can facilitate enhanced PRPG-based compression.
Figure 3:
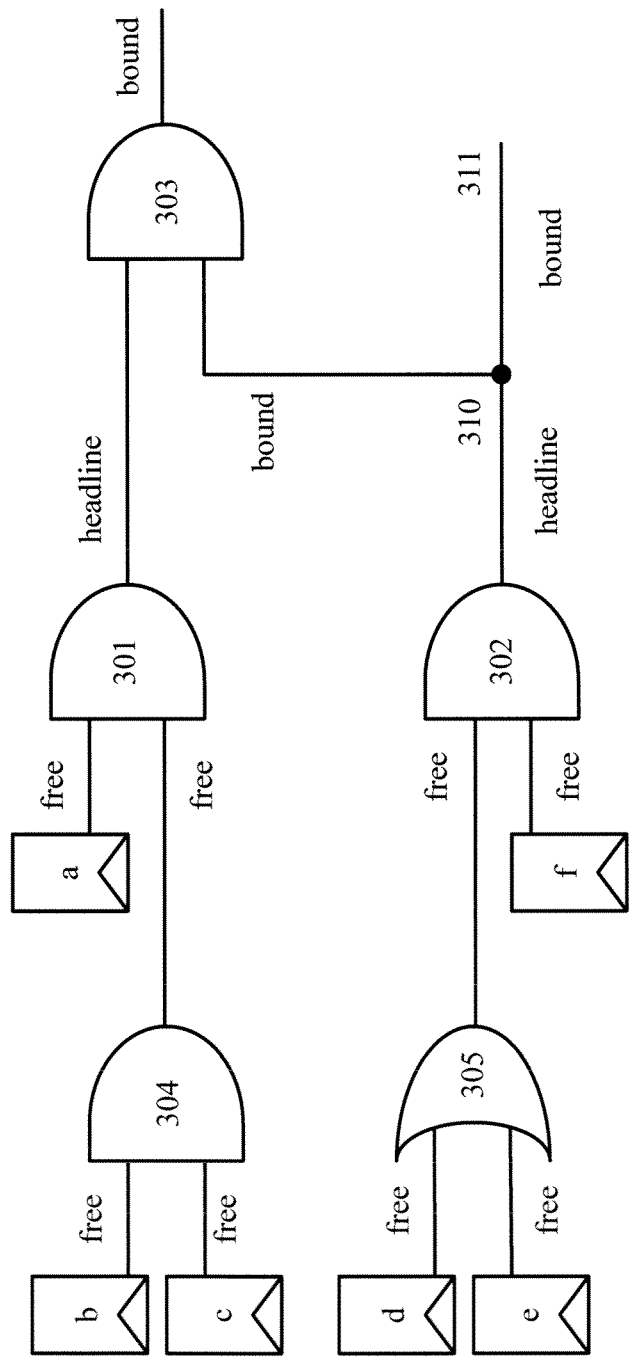
FIG. 3 illustrates conventional headlines using a simplified circuit including five logic gates.

FIG. 2 illustrates an exemplary xheadline generation and preprocessing technique 200, which can facilitate enhanced PRPG-based compression. In step 201, xheadlines can be generated. Conventional headlines were introduced as part of the FAN (Fan-Out Oriented) algorithm. This algorithm is described in an IEEE publication entitled, "On the Acceleration of Test Generation Algorithms", IEEE Trans. on Industrial Electronics, Vol. 36, No. 2, which was published in 1989. The FAN algorithm, which is well known to those skilled in the art of automatic test pattern generation, teaches characterizing decision nodes of a circuit to speed up test generation. FIG. 3 illustrates a simplified circuit including five logic gates: AND gates 301, 302, 303, and 304, and OR gate 305. Scan cells a, b, c, d, e, and f provide inputs to various input terminals of the logic gates. Specifically, scan cell a provides one input to AND gate 301, scan cell f provides one input to AND gate 302, scan cells b and c provide inputs to AND gate 304, and scan cells d and e provide inputs to OR gate 305. AND gates 301 and 302 receive additional inputs from AND gate 304 and OR gate 305, respectively. AND gate 303 receives inputs from AND gates 301 and 302.

As defined in the FAN algorithm, decision nodes downsteam from a fanout point are characterized as "bound", otherwise they are "free". Referring to FIG. 3, only one fanout is present, i.e. at intersection 310. Therefore, all circuit nodes downstream of intersection 310, i.e. the node providing an input to AND gate 303, the output node of AND gate 303, and output node 311, are characterized as bound. A "headline" is a free node immediately preceding (i.e. immediately upstream to) a bound node. Thus, the node between AND gates 301 and 303 is characterized as a headline as is the node between AND gate 302 and intersection 310. Note that a scan cell is considered a boundary point in the FAN algorithm and therefore any output of a scan cell is characterized as free. Note further that for simplicity in test industry terminology a logic gate having an output characterized as a headline can also be called a headline. Thus, for example in FIG. 3, logic gates 301 and 302 can also be called headlines 301 and 302.

Note that ATPG is fundamentally a backtracking process. That is, to ensure a predetermined value on a target node, the process backtracks through the circuit design trying to find a way to set inputs and scan cells to achieve the predetermined value on the target node. The list of nodes used in backtracking is called a frontier. This frontier is constantly changing based on assumed values for various nodes in the list. Backtracking pushes upstream in the circuit design until a solution is found. Finding solutions for the target nodes of the circuit design is called justifying node values.

When justifying node values during test generation in the FAN algorithm, backtracking can stop at headlines. By definition, headlines can be justified with no backtracking because nodes in their fanin cone are fanout free. Notably, no fanin node can drive any logic gate in parallel with the headline, so justification of headlines can wait for the end of test generation.

As a result, decision nodes that are identified as headlines (and any upstream nodes therefrom) are not included in the backtracking process, thereby speeding up test generation. Note that care bits are generated for non-headlines and headlines, wherein those care bits are then mapped to the PRPG seeds.

In accordance with one aspect of the invention, decision nodes characterized as headlines can be extended to additional nodes in the circuit. These extended headlines are called xheadlines herein. In the delayed justification technique of the present invention, care bits are generated only for non-xheadlines. In contrast, xheadlines justification can be delayed until after test generation. Specifically, xheadlines justification can be performed when PRPG seeds are computed for satisfying care bits determined by test generation. After test generation, the care bits and xheadlines can then be mapped to PRPG seeds. Advantageously, this technique can facilitate satisfying more conditions (and thus testing more faults) with each PRPG seed. Thus, the delayed justification technique can advantageously result in more efficient mapping to PRPG seeds, thereby facilitating compression.

Figure 4A:
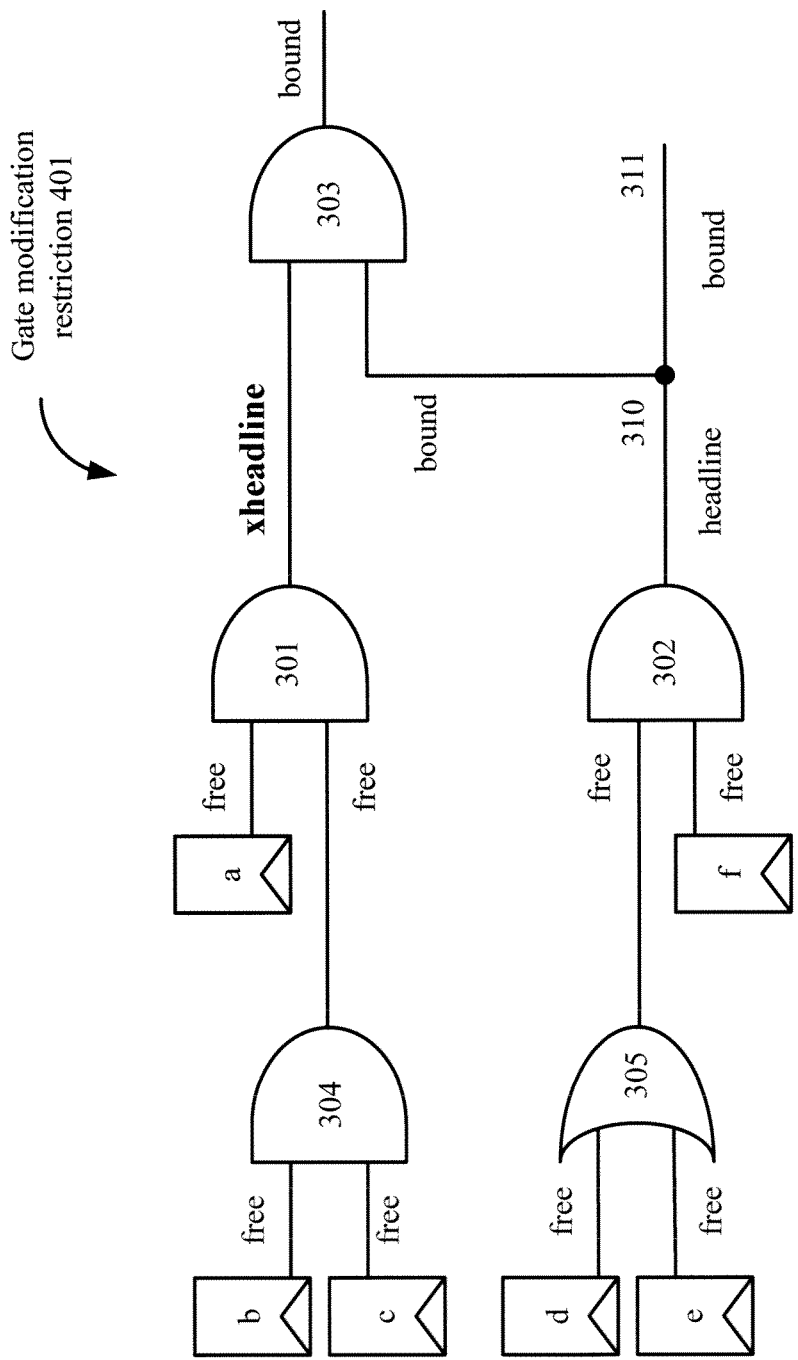
FIG. 4A illustrates the circuit of FIG. 3 after a gate modification restriction used to generate xheadlines.

In one embodiment, to generate xheadlines, three modifications to conventional headlines can be performed. In a first modification, xheadlines can be limited to AND, OR, or XOR gates (or their inverted versions), and require that all unspecified inputs are traceable (i.e. sensitizable) back to scan cells. In one embodiment, any network of gates equivalent to a wide AND, OR, or XOR can also be considered, but any other functions (e.g. AND-OR, etc.) are not. In other embodiments, other functions, such as AND-OR can also be considered. For simplicity and using the former restriction, only AND gate 301 of FIG. 3 is identified as a headline (i.e. the decision node located at the output of AND gate 302 is an AND-OR function and therefore is not considered an xheadline candidate in this modification stage). FIG. 4A illustrates the resulting circuit characterizations after a gate modification restriction 401.

Figure 4B:
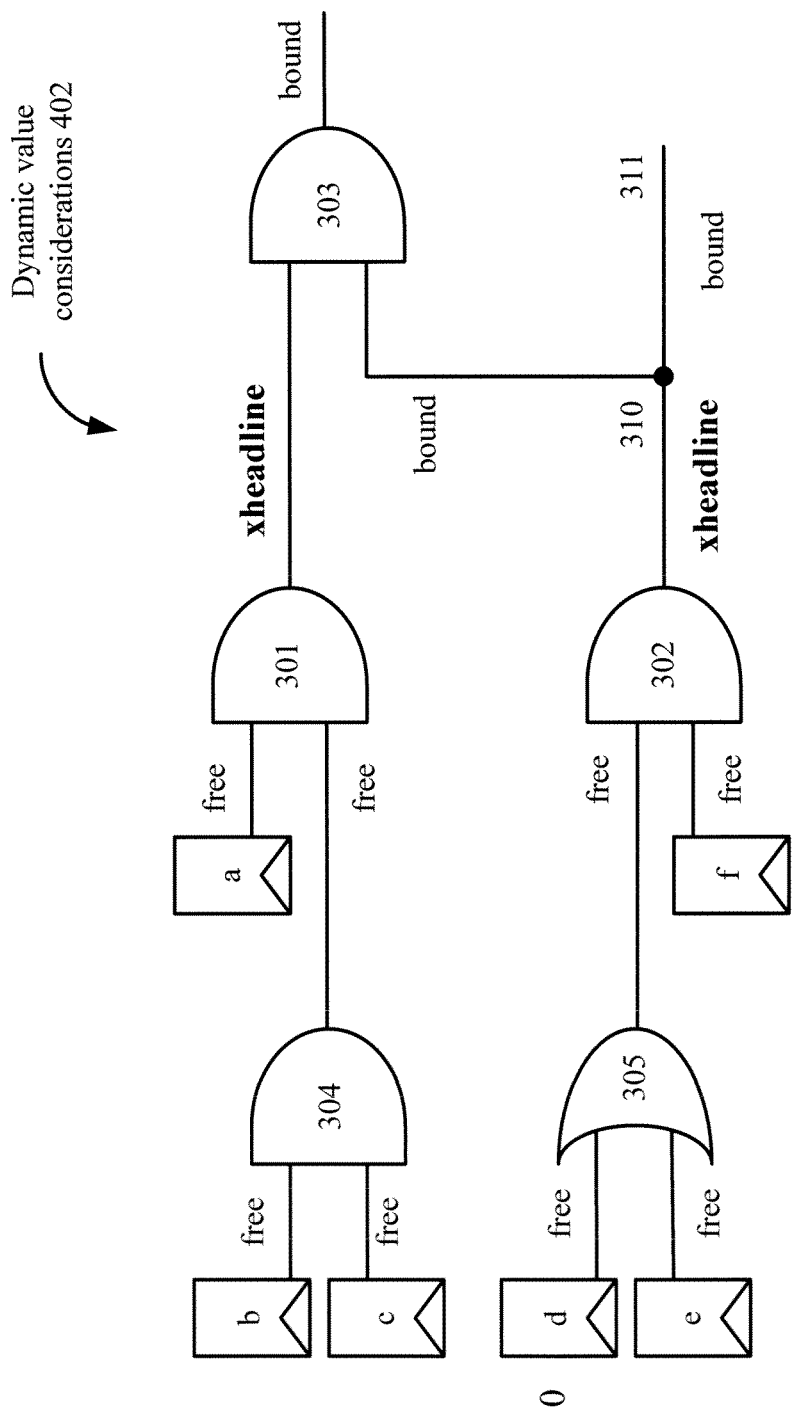
FIG. 4B illustrates the circuit of FIG. 4A after dynamic value considerations.

In a second modification, xheadlines can be identified dynamically based on scan cell values already justified during test generation. For example, referring to FIG. 4B, if scan cell d is assigned value 0, then AND gate 302 effectively has only inputs e and f (i.e. OR gate 305 can be ignored). Therefore, the decision node at the output of AND gate 302 can also be characterized as xheadline. In one embodiment, values assigned to primary inputs (in addition to scan cells) can also be simulated forward, thereby enabling the identification of yet additional xheadlines. The values set for either scan cells or primary inputs are generically referenced herein as "dynamic" values. FIG. 4B illustrates the resulting circuit characterizations after dynamic value considerations 402.

Figure 4C:
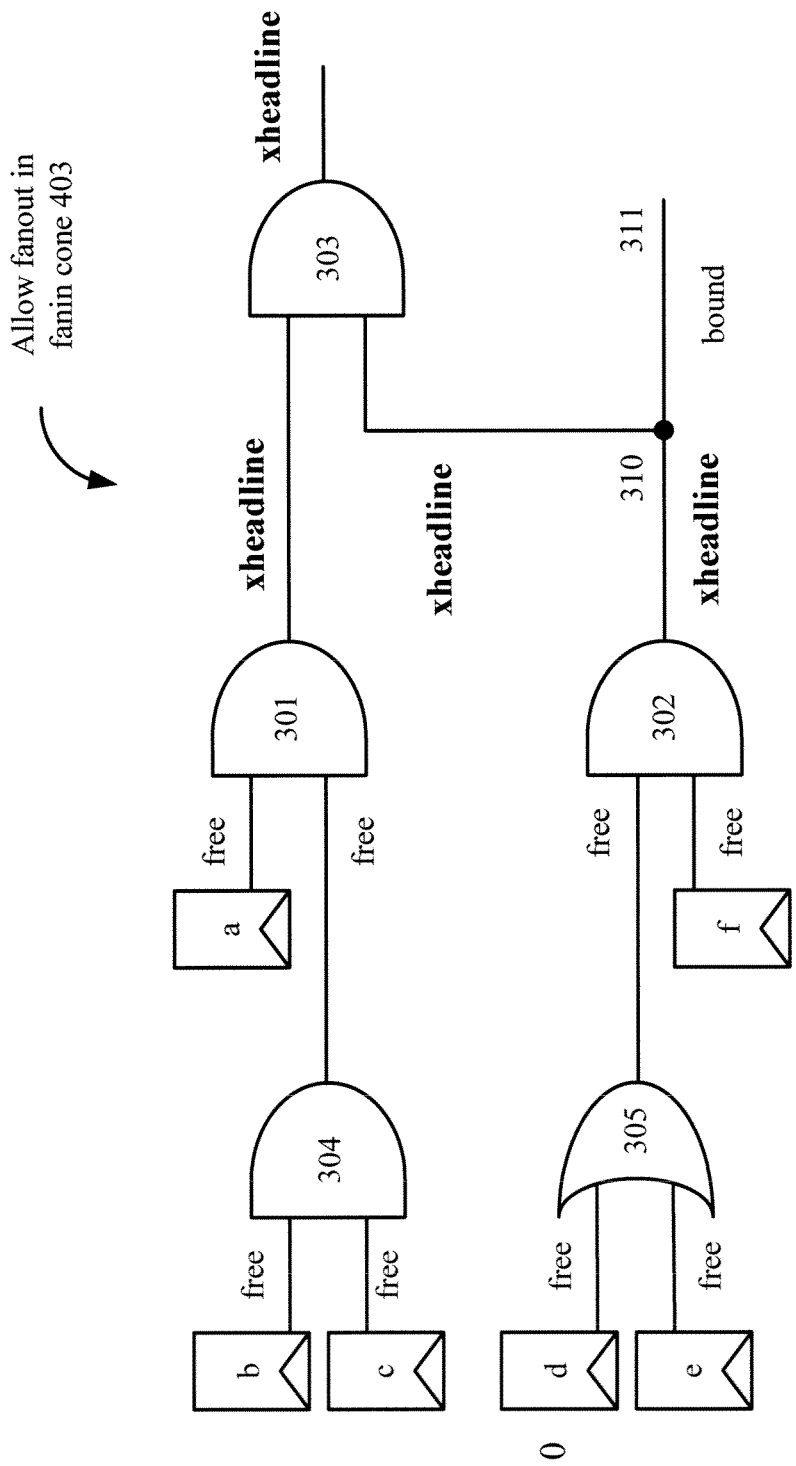
FIG. 4C illustrates the circuit of FIG. 4B after allowing fanout in the fanin cone of an xheadline.

In a third modification, fanout can be allowed in the fanin cone of the xheadline. For example, referring to FIG. 4C, if d=0 then AND gate 303 is effectively a wide AND gate with inputs a, b, c, e, f, thereby allowing both AND gate 301 and intersection 310 (i.e. only the node going to AND gate 303) to be characterized as xheadlines. Note that with this added flexibility comes the risk that not all xheadlines are simultaneously satisfiable.

In one embodiment, to mitigate this risk, an additional step can be included during test generation. Specifically, after successful test generation for a fault, simultaneous satisfiability of all xheadlines is checked. If this check fails and the current fault is the primary target, then test generation is restarted for the current fault. If this check fails and the current fault is a secondary target, then the current fault is aborted and will be re-targeted by future test generation.

As described above, conventional headlines are justified at the end of a successful test generation. For example, referring to FIG. 5 (which illustrates two exemplary scan chains 511 and 512 receiving care bits generated by CARE PRPG 102 and shifted by CARE phase shifter 103), if the output of XOR gate 501 is to be set to 0, then the test generator could assign the following values to all input scan cells feeding XOR gate 501: b=0, c=1 and d=1. Next, PRPG seed computation would solve a system of linear equations that include care cells b, c and d and their relationship, through CARE phase shifter 103, to the initial seed in the PRPG cells, bits W, X, Y, Z. For instance:

$$b=W+Y=0$$

$$c=X+Y+Z=1$$

$$d=W+Z=1$$

In accordance with one aspect of the present invention, justification of xheadlines can be postponed until after test generation is complete. In this manner, conventional care cells and xheadlines are considered only when PRPG seeds are computed. Thus, in FIG. 5, the xheadline XOR 501 is directly passed to the PRPG seed solver instead of individual care cells b, c, and d. As a result, only one equation {b+c+d=X=0} must be solved instead of three.

In effect, the XOR functions of the PRPG and phase shifter have been merged, adjusted for the delay of scan shifting, with the function of XOR gate 501 to reduce the number of equations. Notably, the probability of a PRPG seed existing that satisfies all required conditions is related to the PRPG length and the number of linear equations. Previously, the number of equations was equated to the number of care cells. In contrast, by using xheadlines, several care cells can be addressed in a single equation, thereby reducing the number of seeds needed to encode the entire pattern set. Additionally, when satisfying an xheadline, one can choose which input to set to favor existing seeds, thereby reducing the number of cycles when internal shifting is stopped while awaiting a PRPG shadow load.

In general, for an n-input XOR network (implemented as one or more XOR gates) which qualifies as an xheadline, the n equations that would typically result in n care cells can be replaced with one equation for one XOR xheadline. Similar savings are possible for AND or OR xheadlines as described in detail below.

Incremental Satisfiability of XOR Headlines, Need for XOR Xheadline Transformation Referring back to FIG. 2, step 202 can include the preprocessing of the xheadlines to account for various conditions. One such condition is the incremental satisfiability of XOR headlines. As described in further detail below, the incremental satisfiability of XOR headlines necessitates a transform (step 202A).

The number of bits a single PRPG seed can encode is limited by the PRPG length, e.g. generally at most a few hundred conditions, which can affect care cells and xheadlines. Note that test generation can merge multiple faults and pack thousands of care bits into each pattern, especially at the beginning of the test set. Fault merging could be stopped when reaching the PRPG encoding limit, but highest compression is achieved when fault merging is exploited and each scan load is encoded with multiple PRPG seeds or with multiple or continuous data streams into the PRPG. In this case, several systems of linear equations are solved, each for a subset of care cells, typically divided by shift cycle.

In one embodiment of the delayed justification technique, multiple PRPG seeds can be used per scan load, starting with the first shift cycle and computing each seed to satisfy all conditions for as many shift cycles as possible before switching to the next seed. Therefore, the inputs of an xheadline may be covered by more than one seed. For example, referring to XOR gate 502 of FIG. 5, a seed may cover shifts 0 to 2 (and thus input a) and another seed shifts 3 and up (and thus input c).

When satisfying XOR xheadlines, it is only necessary to set the inputs corresponding to the shift cycles covered by the last seed, accounting for values already set on other inputs by previous seeds. For example, referring to FIG. 5, if the output of XOR gate 502 is to be set to 0 and input a has already been serendipitously set to 0 by a seed for shifts 0 to 2, then the next seed (for shifts 3 and on) must set input c to 0 to achieve the desired target value.

However, when inputs are shared downstream (such as input c that is provided to XOR gates 502 and 503), conflicts can arise. For example, assume (1) XOR gates 501 and 502 are both to be set to 0 and (2) a seed is computed for shift cycles 0 to 2 that results in the assignments a=0, b=1, and d=0. When computing the seed for shift cycle 3, a conflict arises because XOR gates 501 and 502 cannot both be set to 0. Thus, although the test generator has verified that all xheadlines are simultaneously satisfiable, assigning values to some but not all xheadline inputs can cause an unsatisfiable condition.

Figure 5:
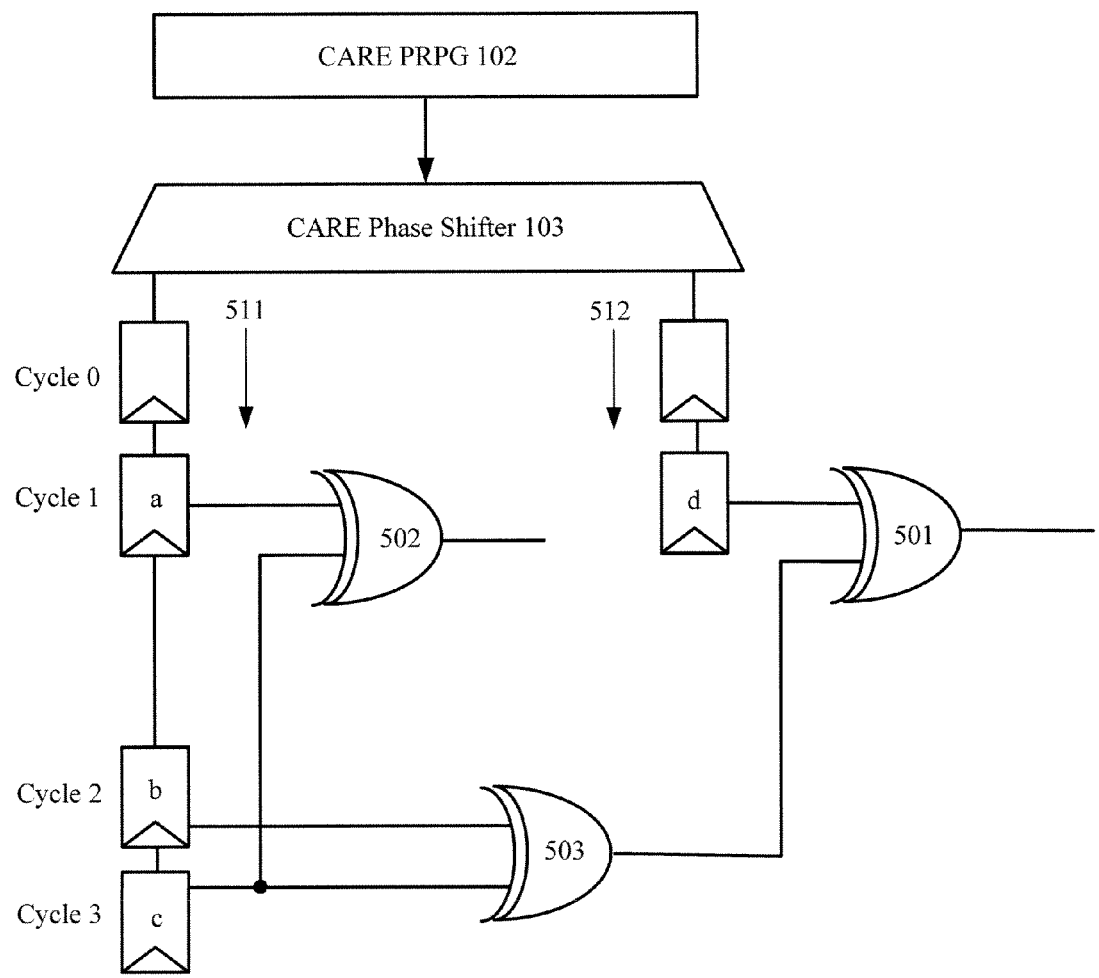
FIG. 5 illustrates how conventional care bits and xheadlines are justified for two scan chains and exemplary circuit logic.
Figure 6:
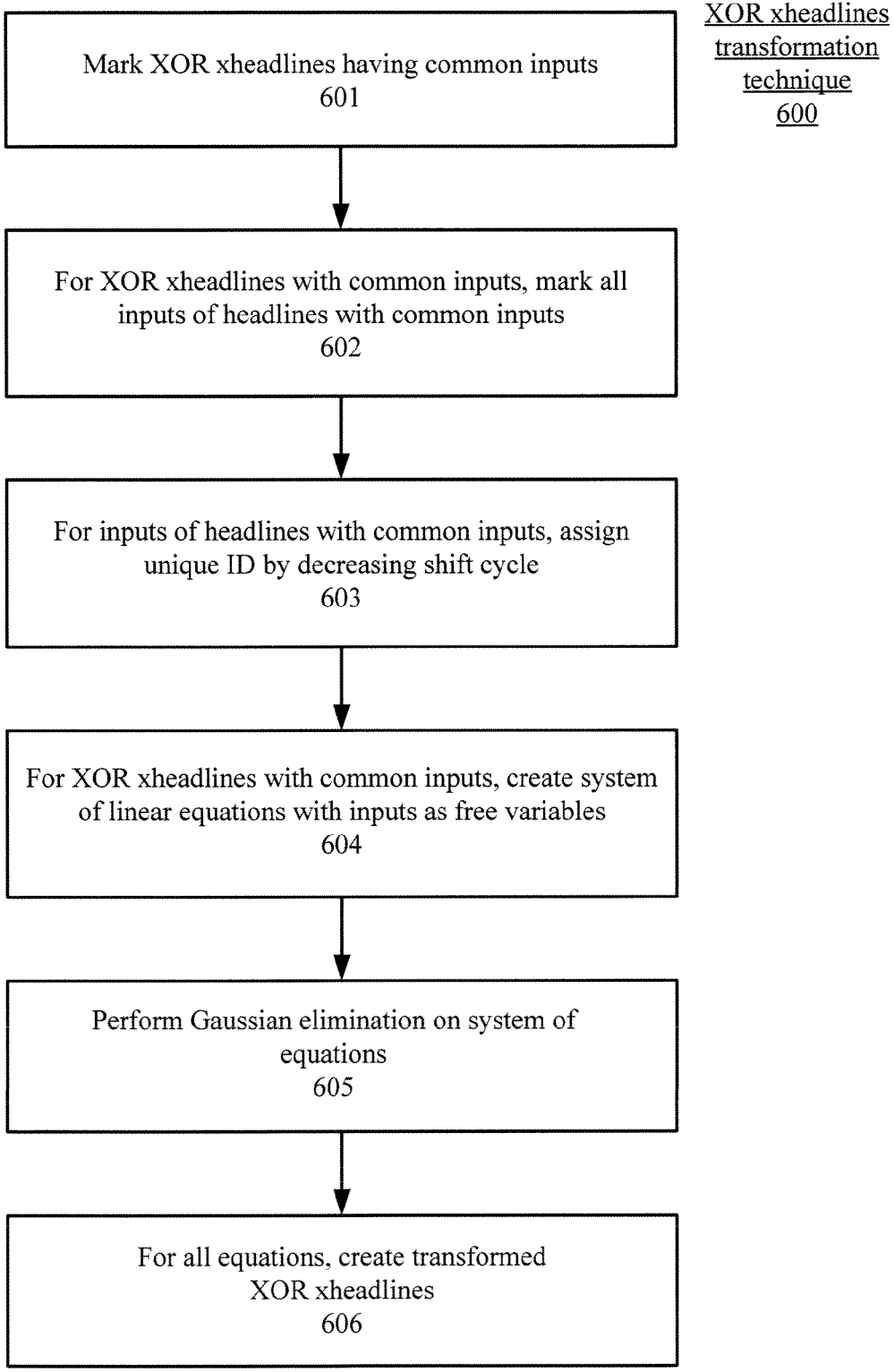
FIG. 6 illustrates an XOR transform technique that can be used in xheadline preprocessing.

Therefore, in one embodiment, XOR xheadlines can be transformed in a technique illustrated in FIG. 6. Step 601 can mark all XOR xheadlines having at least one common input. Step 601 is performed because xheadlines with no common inputs cannot cause unsatisfiable conditions to arise and, if included, would only slow down the algorithm. For example, xheadlines 502 and 503 (FIG. 5) have a common input c.

Step 602 can mark all inputs of all xheadlines (e.g. including AND as well as OR xheadlines) with common inputs. (Note that the marking performed in steps 601 and 602 is well known to those skilled in the art of test pattern generation and therefore is not described in detail herein.) Step 602 can significantly reduce the size of the problem for subsequent steps, i.e. from all scan cells in the design (which can be in the hundreds of thousands or even millions) to only the inputs of xheadlines with common inputs (typically tens to a few hundred). For example, inputs a, b, c and d (FIG. 5) would be marked during step 602.

Step 603 can assign unique id (identification) numbers, starting with 0 for the cell with the highest shift cycle number.

Figures 7, 8A:
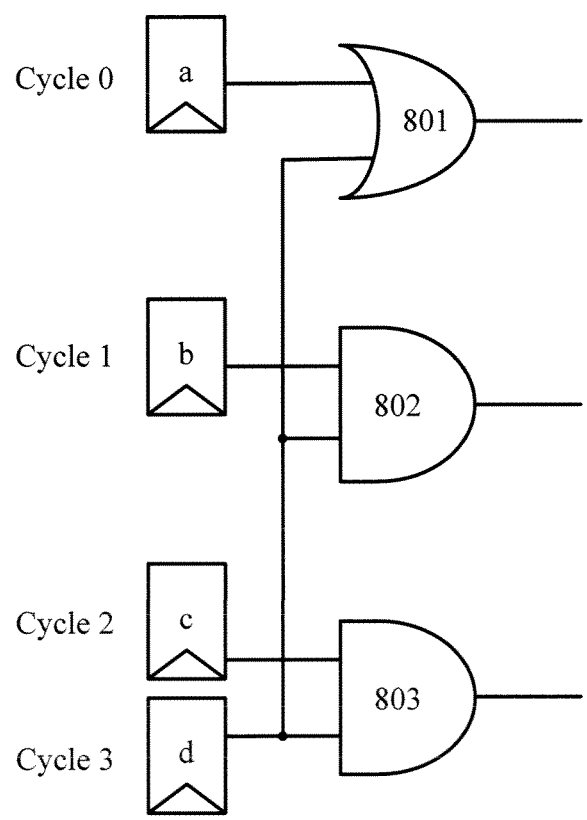
FIG. 7 illustrates the linear system of equations for xheadlines (used during the XOR transform technique) before and after Gaussian elimination.
FIG. 8A illustrates an exemplary circuit that fails incremental satisfiability of AND/OR xheadlines.

For example, ids (0, 1, 2, 3) can be assigned, respectively, to inputs (c, b, a, d). Note that cells a and d are in the same shift cycle (cycle 1) so an arbitrary ordering between a and d is chosen. Step 604 can then create a system of linear equations, in increasing id numbers, with inputs as free variables. Step 605 can perform Gaussian elimination. Note that the set of XOR xheadlines with common inputs is a subset of all xheadlines guaranteed by the test generator to be simultaneously satisfiable. Thus, the linear system is guaranteed to have a solution. FIG. 7 illustrates the linear system of equations 701 after step 604 as well as the linear system of equations 702 after Gaussian elimination. In FIG. 7, each row represents one of the two equations. Specifically, each equation corresponds to the XOR xheadlines shown in FIG. 5. The columns show, left to right, values for inputs c, b, a, d, respectively, and the output value. Thus, the first column shows values for shift cycle 3, the second column values for shift cycle 2, etc. For example, the first row in 701 represents the equation for XOR gate 502 which must be 0 and has inputs a and c. Likewise, the second row in 701 represents the equation for XOR gate 501, which is the XOR of inputs c, b and d and must also be 0.

Referring back to FIG. 6, step 606 creates the transformed XOR xheadlines by replacing all previous XOR xheadlines having common inputs. For example, in FIG. 7, the two XOR xheadlines represented by the rows of 701 are replaced by two new XOR headlines corresponding to the rows of 702. In one embodiment, the transformed XOR xheadlines number no more than the ones replaced (but can be fewer in number). In the example of FIG. 5, the XOR of inputs c and a must be 0 (same as gate 502), and the XOR of inputs b, c, d must be 0.

Figure 13:
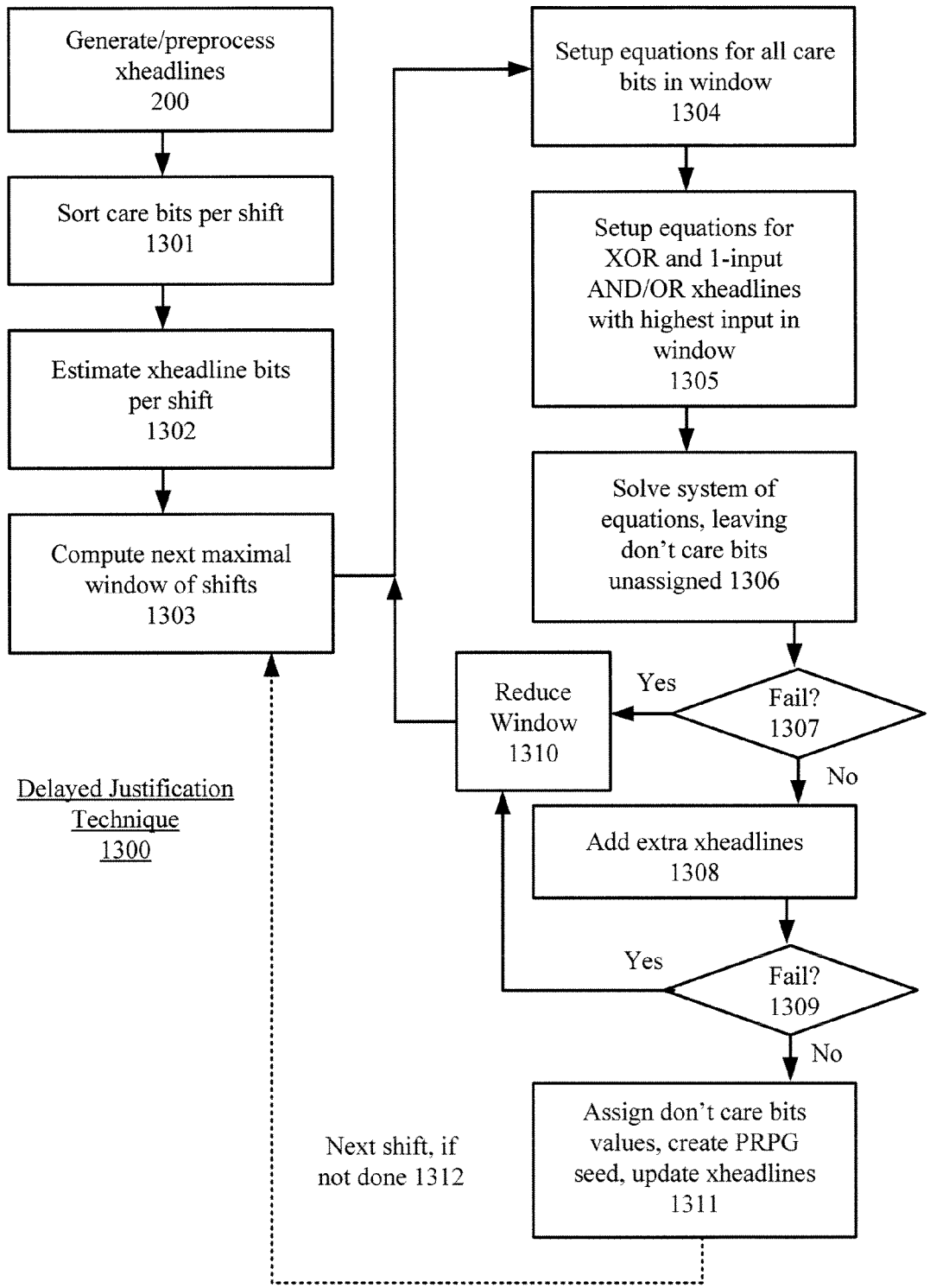
FIG. 13 illustrates an exemplary delayed justification technique, which includes mapping the xheadlines and care bits to PRPG seeds at the end of test generation for one pattern.

The first seed covers shift cycles 0 to 2 (wherein each seed covers the maximum possible shift range, as detailed in FIG. 13), thus inputs a, b, and d. The first new XOR xheadline (which will replace XOR 502) is not considered at this time, as it includes another input, i.e. input c. The second new XOR xheadline (which will replace XOR 503) is then considered. A possible solution is a=0, b=1, and d=1. The next seed must then set c=0 to also satisfy the first new XOR xheadline. By construction, the solution guarantees that the original XOR xheadlines 501-503 are satisfied.

The transformation performed ensures that, for any new XOR xheadline, the input of the last shift cycle (left-most column in FIG. 7) is not shared. Thus, unsatisfiable conditions will not be created no matter which cycle is the last cycle covered by a seed.

The pseudo code below can implement steps 601-606:

```
for all XOR xheadlines
        mark xheadlines with common inputs
end
for all XOR xheadlines with common inputs
        mark all inputs of xheadlines with common inputs
end
for all inputs of headlines with common inputs
        assign unique id by decreasing shift cycle
end
for all XOR xheadlines with common inputs
        create equation with inputs as free variables
end
perform Gaussian elimination of system of equations
for all equations
        create new XOR xheadline
end
```

Incremental Satisfiability of AND/OR Xheadlines, Necessitates AND/OR Augmentation An AND or OR xheadline is satisfied by setting any one input to the controlling value (for an AND headline, the controlling value is 0, whereas for an OR headline, the controlling value is 1). Each AND/OR xheadline has one or more inputs that are set by the last seed for the xheadline. For example, referring to FIG. 8A, a seed for shift cycles 0 to 2 may set inputs a=0, b=1, c=1, so none of the AND/OR xheadlines are yet satisfied. The next seed, for cycles 3 and after, must set input d. Unfortunately, the sharing of input d leads to a conflict. Thus, at this point, no value can satisfy all three headlines of FIG. 8A.

Figure 9:
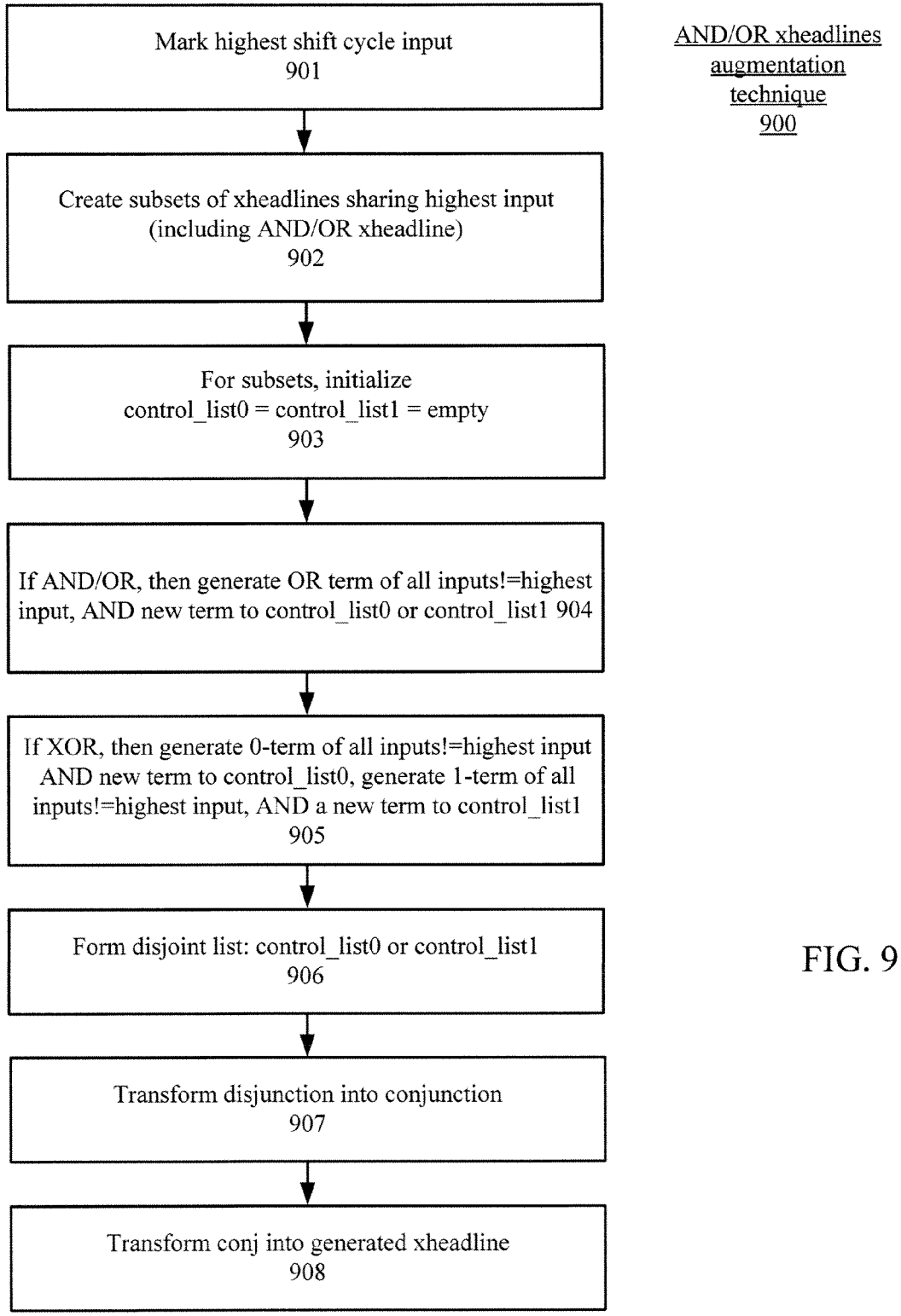
FIG. 9 illustrates an exemplary AND/OR xheadlines augmentation technique.

Unlike XOR xheadlines, ensuring incremental satisfiability of AND/OR xheadlines results in added conditions. FIG. 9 illustrates an exemplary technique 900 that generates xheadlines for AND/OR incremental satisfiability. Technique 900 can advantageously generate conditions on inputs set in earlier cycles so that setting the remaining inputs in later cycles is always possible, conflict-free. These conditions can be addressed by augmenting the AND/OR xheadlines (which is step 202B, FIG. 2).

Step 901 starts with identifying the input corresponding to the highest shift cycle of each xheadline (including AND/OR/XOR). For example in FIG. 8A, xheadlines 801, 802 and 803 all have highest input d. Step 902 then creates subsets of xheadlines sharing the highest input. In the case of FIG. 8A, the xheadlines 801, 802 and 803 are placed in a subset. Each subset is processed independently and can result in new xheadlines. By construction, the subsets are disjoint. That is, an xheadline has a unique highest input, and therefore inherently belongs to only one subset.

Step 903 initializes two logical terms, e.g. Control_list0 and control_list1, which are used to accumulate conditions required to ensure that all xheadlines in a subset can be satisfied whether the common highest input is set to 0 or 1. For example, in FIG. 8A, d=0 already satisfies xheadlines 802 and 803, so step 904 (which control term generation for AND and OR xheadlines) only generates the term "a" for headline 801, which is ANDed to control_list0. Similarly, d=1 already satisfies xheadline 801 so step 904 generates the term b(bar) (wherein bar represents logical inversion) for xheadline 802 and c(bar) for xheadline 803. Thus, control_list1 becomes b(bar) AND c(bar). Step 906 then forms the disjunction disj=a OR (b(bar) AND c(bar)).

The expression formed at step 906 represents the condition that must be satisfied to ensure incremental satisfiability of all xheadlines in the subset. Step 907 can transform the disjunction equation into a conjunction equation using a simple algebraic manipulation. For example, disj=a OR (b(bar) AND c(bar)) becomes conj=(a OR b(bar)) AND (a OR c(bar)). Then, step 908 can represent each term of the conjunction as a new generated AND or OR xheadline, as exemplified in FIG. 8B, wherein gates 811 and 812 are the newly generated OR xheadlines.

Figure 8B:
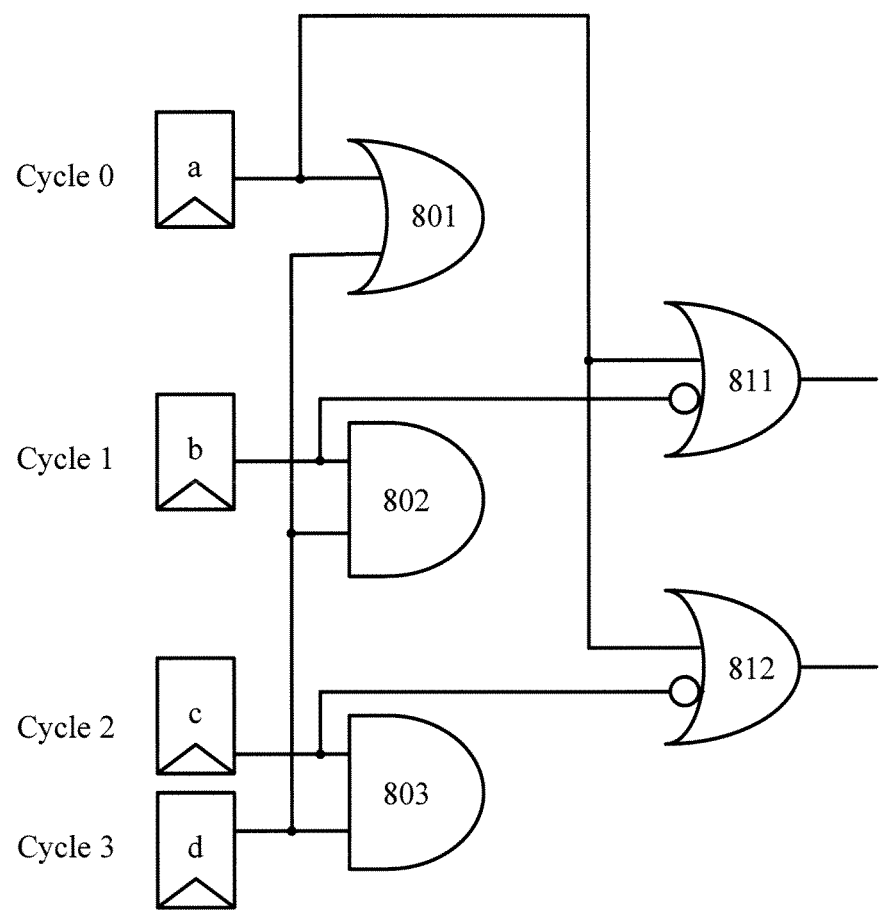
FIG. 8B illustrates the circuit of FIG. 8A that augments AND/OR xheadlines to ensure incremental satisfiability of AND/OR xheadlines.

An incremental solution can now be computed conflict free. The first seed, for cycles 0 to 2, sets a=1, which satisfies xheadlines 801, 811, and 812 (FIG. 8B). Inputs b and c need not be set at this time because the remaining xheadlines have another input d in a higher shift. The next seed then sets d=0, which satisfies the remaining xheadlines 802 and 803.

To explain step 905 (FIG. 9), which was not used in the above example, assume gate 801 in FIG. 8A is an XOR gate, which must be set to 1 (its control value). Unlike AND/OR xheadlines, XOR xheadlines contribute a term to both control_list0 and control_list1. Therefore, in step 906 disj=a OR (a(bar) AND b(bar) AND c(bar)). This disjunction can be transformed into an equivalent conjunction conj=(a OR b(bar)) AND (a OR c(bar)) and the rest of the example follows the same as before. Notably, during preprocessing, an XOR xheadline need not be augmented (as described above for AND/OR xheadlines).

The pseudo code below can implement steps 901-908:

```
for all xheadlines
        mark highest shift cycle input ("highest input")
end
for all xheadlines
        create subsets of headlines sharing highest input
        (each subset must include an AND/OR xheadline)
end
for all subsets of headlines
        initialize control_list0 = control_list1 = empty
        for all xheadlines in subset
                if AND/OR:
                        generate OR term of all inputs! = highest input
                        AND new term to control_list0 or 1
                end
                if XOR:
                        generate 0-term of all inputs! = highest input
                        AND new term to control_list0
                        generate 1-term of all inputs! = highest input
                        AND new term to control_list1
                end
        end
        disj = control_list0 OR control_list1
        transform disjunction disj into conjunction conj
        transform conj into generated xheadline
end
```

Figure 10A:
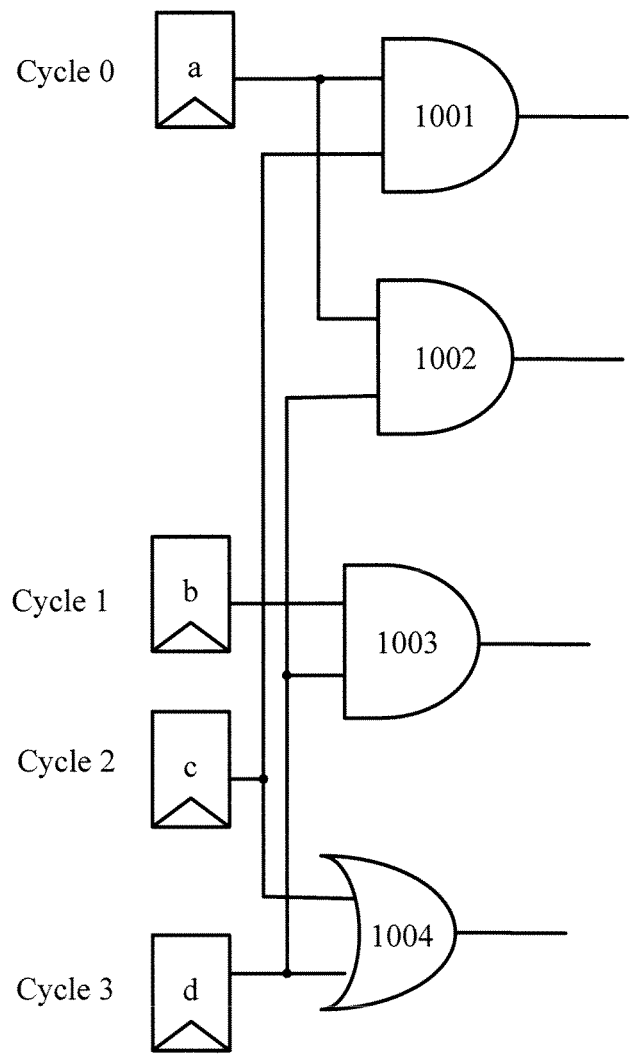
FIGS. 10A and 10B illustrate an exemplary circuit before and after repeated application of the AND/OR xheadlines augmentation technique of FIG. 9.
Figure 10B:
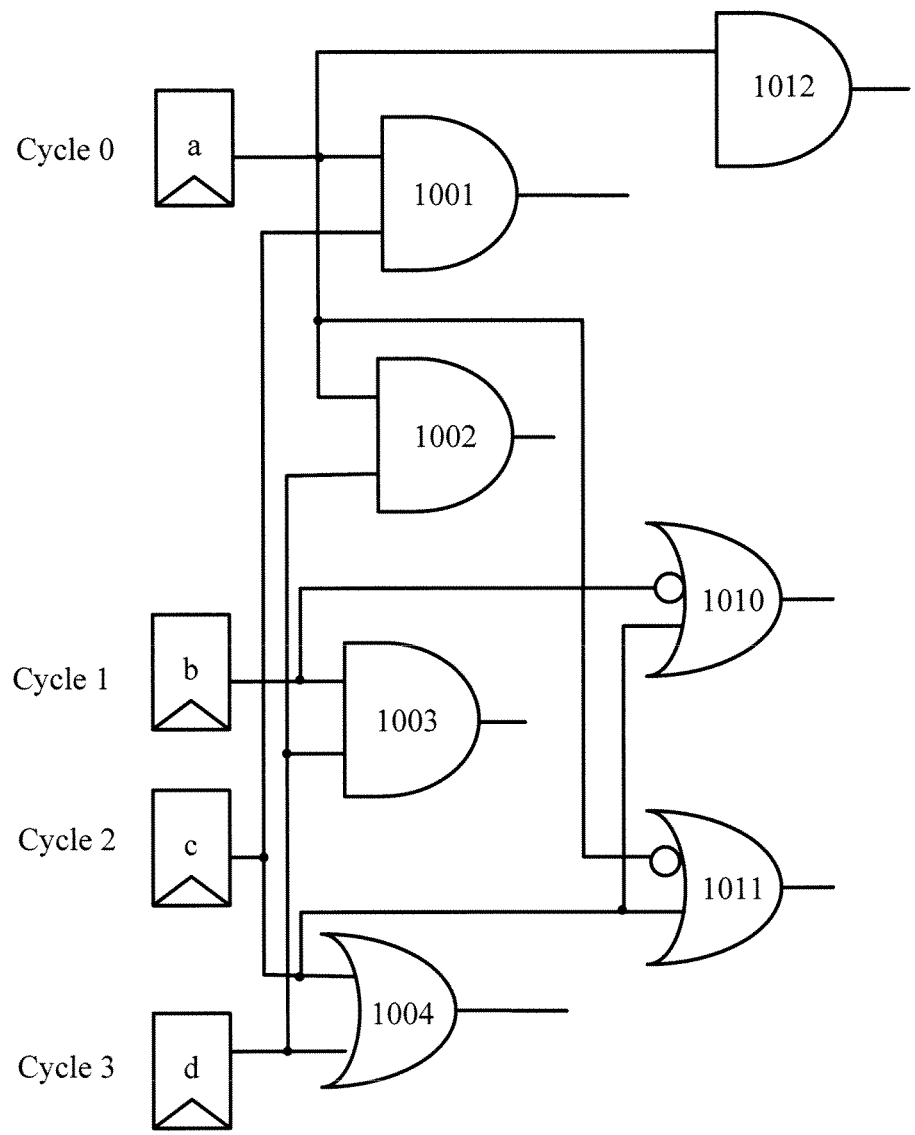

As new xheadlines are generated, it is necessary to repeatedly check for newly generated shared inputs. Consider the example in FIG. 10A in which xheadlines 1002, 1003, and 1004 share highest shift input d. FIG. 10B illustrates two new OR xheadlines 1010 and 1011, which can be generated by applying technique 900 (FIG. 9). In FIG. 10B, if seeds were computed with xheadlines 1010 and 1011, then a conflict could still arise if, for instance, the first seed, for cycles 0 and 1, set a=1 and b=1 (no xheadlines are satisfied so far but none had to be as all have inputs in later cycles) making it impossible to satisfy xheadlines 1001 and 1011 simultaneously.

However, before proceeding to seed computation, technique 900 can be re-applied and a new subset of xheadlines emerges, i.e. xheadlines 1001, 1010, and 1011. These gates share common highest input c. Step 906 results in disj=a(bar) OR (a(bar) AND b(bar))=a(bar), i.e. a must be 0 (represented by the newly generated xheadline 1012). No further common highest input xheadlines are found, so iterative application of technique 900 ends. An incremental solution can now be computed: the first seed, for cycles 0 and 1, sets a=0 to satisfy xheadline 1012, which also satisfies xheadlines 1001, 1002, and 1011. Input b need not be set at this time because the remaining xheadlines have inputs in higher shifts. Next, input c must be set to 1 to satisfy the xheadline 1010, which also satisfies the xheadline 1004, and then d=0 for the xheadline 1003. If the first seed had fortuitously been set to b=0, this seed would have satisfied gate 1003 and 1010 and would be followed by either c=1 or d=1 for the xheadline of the output of gate 1004. Even in the absence of fortuitous assignments that satisfy xheadlines before the highest input must be set, a solution that assigns fewer than all inputs is often found. For example, only 2 out of 4 inputs were set in FIG. 8B, and 3 out of 4 in FIG. 10B.

Reducing Common Input Headlines

As described above, when incrementally satisfying xheadlines, unsatisfiable conditions can be avoided if early input assignments to non-controlling values are avoided. Within these constraints, multiple AND/OR xheadlines can be satisfied by assigning a single, common input to the controlling value. Generally, assigning a value to the highest shared input has the additional benefit of reducing the need for generated xheadlines to ensure incremental satisfiability.

Figure 11:
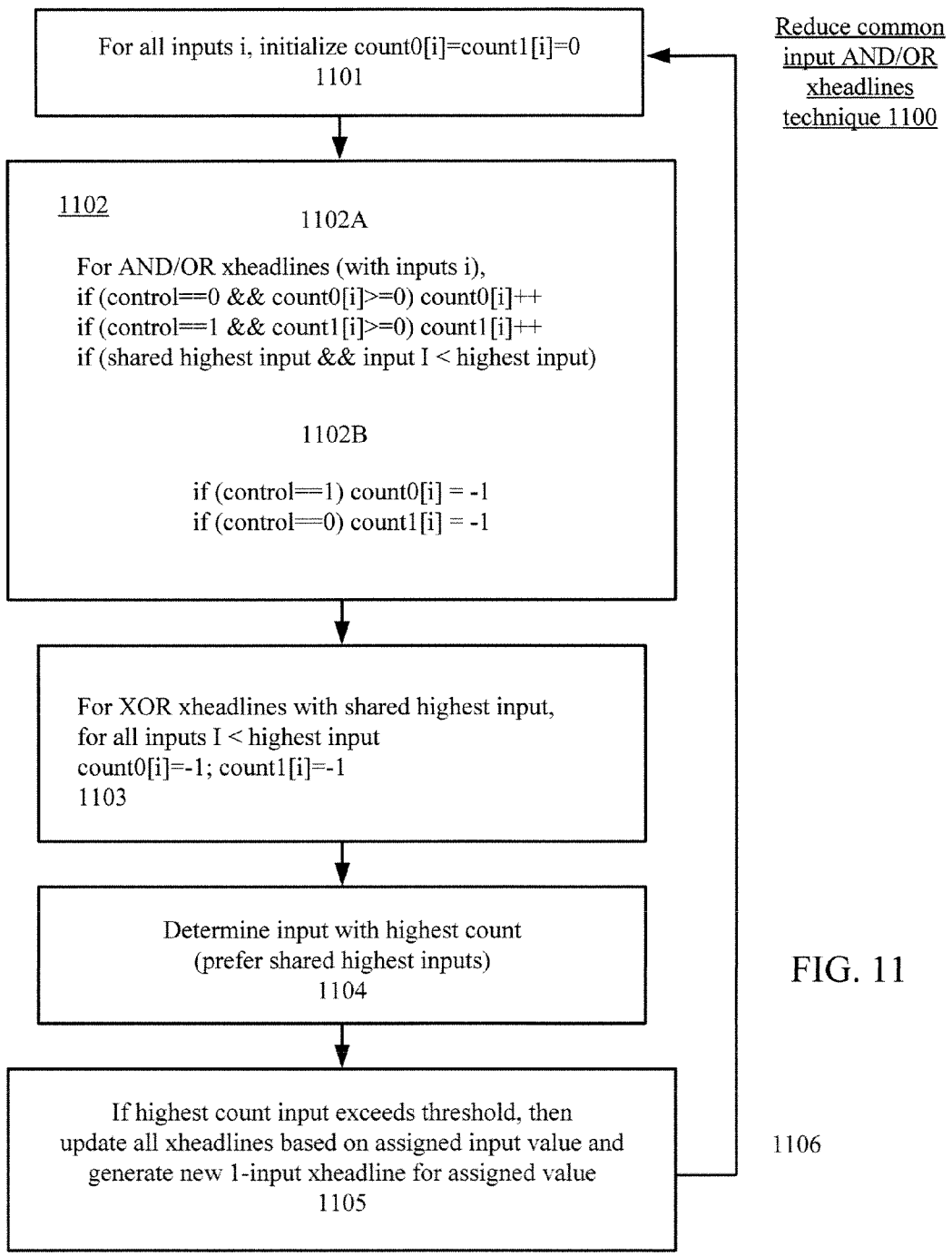
FIG. 11 illustrates a technique for reducing AND/OR xheadlines having common inputs.

FIG. 11 illustrates a technique 1100 for reducing AND/OR xheadlines having common inputs. This reduction of common input AND/OR xheadlines can be performed during preprocessing in step 202C (FIG. 2). In step 1101, two counters (count0 and count1) are initialized for every input i. In step 1102, count0 and count1 are modified as follows. For all inputs of AND/OR xheadlines, the counter corresponding to the controlling value is incremented, unless it has already been set to −1 (step 1102A). Then, for all but the highest input of AND/OR xheadlines with shared highest input, the counter corresponding to the non-controlling value is set to −1 (step 1102B). In step 1103, for XOR headlines with shared highest input, both counters of all but the highest input are set to −1. This setting ensures that no assignments will be made that can create unsatisfiable conditions.

In step 1104, the input with the highest counter value is determined, wherein the shared highest inputs are preferred. In step 1105, if the highest count exceeds a certain threshold (e.g. 10), then the selected input is set to the highest count value. At this point, all xheadlines are updated accordingly. For example, a dominant input value satisfies the xheadline so it can be removed from further consideration. In contrast, an input at a non-dominant value can be removed from the xheadline. Specifically, an AND xheadline is satisfied and can be removed if one of its inputs is 0, while an OR xheadline can be removed if one of its inputs is 1. Further, an input at 1 can be removed from an AND xheadline, and an input at 0 can be removed from an OR xheadline. Setting an input to a value can be represented by a new 1-input AND/OR xheadline. Note that technique 1100 can be repeated until no more reductions are possible (as shown by arrow 1106).

The pseudo code below can implement steps 1101-1105:

```
for all inputs i
        initialize count0[i] = count1[i] = 0
end
for all xheadlines
        if AND/OR: for all inputs i
                if (control==0 && count0[i]>=0)count0[i]++
                if (control==1 && count1[i]>=0)count1[i]++
                if (shared highest input && input i<highest input)
                        if (control==1)count0[i]=−1
                        if (control==0)count1[i]=−1
                end
        end
        if XOR with shared highest input
                for all inputs i < highest input
                        count0[i]=−1; count1[i]=−1
                end
        end
determine input with highest count (prefer shared highest inputs)
if highest count input exceeds threshold
        update all xheadlines based on assigned input value
        generate new 1-input xheadline for assigned value
end
```

Figure 12A:
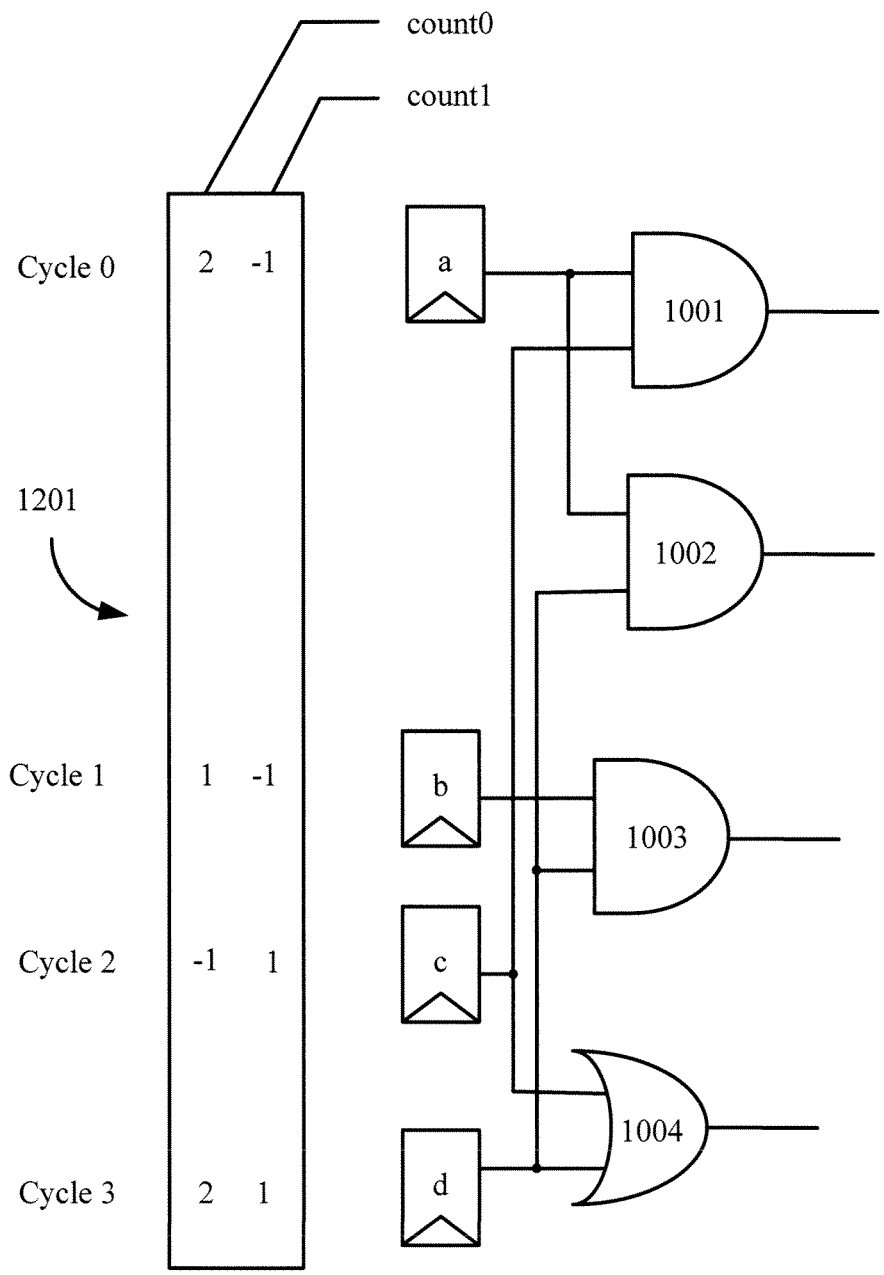
FIGS. 12A and 12B illustrate an exemplary circuit before and after implementation of the AND/OR xheadline reduction technique shown in FIG. 11.
Figure 12B:
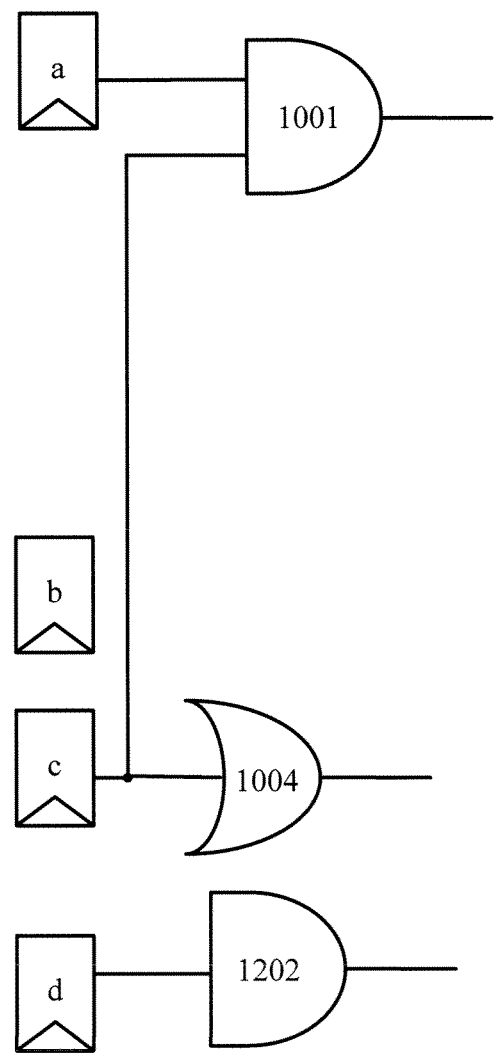

FIGS. 12A and 12B illustrate an exemplary implementation of technique 1100. FIG. 12A illustrates a simple circuit including the incremental values determined by step 1102 for xheadline 1001 in count0 for inputs a and c. Step 1103 sets count1 of input a to −1 because of the shared highest input, c. For xheadline 1002, step 1102 increments count0 for inputs a and d, and step 1103 sets count1 of input a to −1 because of the shared highest input, d. The final values of count0 and count1 after processing all four xheadlines are shown in table 1201.

At step 1005, inputs a and d tie for the highest count, but input d is preferred because it is a shared highest input.

Assuming the threshold is 2, input d is assigned value 0 and the xheadlines are modified as shown in FIG. 12B. As noted above, xheadlines with an input at a dominant value are already satisfied and therefore can be deleted; inputs at a non-dominant value can be deleted because they do not contribute to the AND or OR xheadline. The reduced xheadlines are then used for seed generation. Specifically, headlines 1002 and 1003 of FIG. 12A are replaced by new headline 1202. Repeating the steps of technique 1100 finds no further reduction opportunities. Therefore, a solution results with the following values: d=0, c=1, and a=0 (wherein b is not part of the solution). Note that this solution is the same one obtained using the configuration shown in FIG. 10B, but with less complexity (which would be discernable by those skilled in the art). Therefore, technique 1100 is preferably advantageously applied before steps 202A and 202B when preprocessing xheadlines to reduce computational complexity.

Mapping Xheadlines to PRPG Seeds

FIG. 13 illustrates an exemplary delayed justification technique 1300, which includes mapping the xheadlines and care bits to PRPG seeds at the end of test generation for one pattern. Technique 200, which generates and preprocesses the xheadlines, forms part of delayed justification technique 1300. As described above, technique 200 can repeat technique 1100 (FIG. 11) to decision nodes of the circuit until no further reductions are possible. Repeating technique 1100 can fortuitously satisfy some AND/OR xheadlines and possibly reduce the number of inputs of some XOR xheadlines. Technique 200 can also transform XOR xheadlines using technique 600 (FIG. 6) to ensure incremental satisfiability of XOR xheadlines. Technique 200 can also repeat technique 900 (FIG. 9) as needed to ensure incremental satisfiability of AND/OR headlines.

Steps 1301-1312 can be characterized as mapping of the xheadlines (and care bits) to the PRPG seeds. Step 1301 can sort all generated, conventional care bits per shift position so that PRPG seeds can be incrementally generated, starting with the first shift, whereby each seed is computed to satisfy conditions for as many shifts as possible. Step 1302 can then estimate the xheadline requirements per shift. For PRPG reseeding, the effect of xheadlines on PRPG bits can be estimated as follows. XOR xheadlines will require one bit in the highest shift cycle, whereas AND/OR headlines will likely require $2^{(1-N)inputs}$ bits in the highest shift cycle. This estimation considers the effects of fortuitous satisfiability and opportunistic satisfiability. For instance, a 1-input xheadline will require 1 bit; whereas a 2-input xheadline will require, on average, ½ bit, because it has a 50% chance to be satisfied with 0 bits, i.e. no addition to the PRPG seed requirements.

In step 1303, a maximal window of shifts can be computed, starting with the current shift cycle (initially cycle 0) and extended until either the last shift or until the sum of all care bits and headline bits is within a margin of the PRPG length.

In step 1304, a system of equations can be created from all the care bits in the window. In step 1305, the system of equations can be added to by using all XOR and 1-input AND/OR xheadlines which have their highest shift in the current window. Notably, each care bit, XOR xheadline and 1-input AND/OR xheadline directly maps to exactly one equation. Note that 1-input xheadlines may be either generated xheadlines (see FIGS. 8B and 10B) or multi-input xheadlines whose other, lower-shift cycle inputs have been set to non-controlling values by previous seeds.

Step 1306 can solve the system of equations, e.g. by Gaussian elimination. At this point, any don't care inputs remain unassigned. Note that step 1306 implements a deterministic method of satisfying AND/OR xheadlines. If the system of equations has no solution, i.e. a failure occurs in step 1307, then the window of shifts is reduced in step 1310 and the process returns to step 1304 using a new, smaller window.

Once a solution is found in step 1307, then extra xheadline equations can be added in step 1308. FIG. 14 illustrates a technique 1400 for adding these extra xheadline equations and determining whether specific AND/OR xheadlines are to be mapped to the current PRPG seed or a future PRPG seed. In technique 1400, two similar loops (described in reference to steps 1401 and 1402) are run. In step 1401, equations are added for all AND/OR xheadlines which have their highest input in the current window and thus must be satisfied by the current PRPG seed. In step 1402, equations are added for all other AND/OR xheadlines.

In one embodiment, for both steps 1401 and 1402, each input of each xheadline is tried in turn. An equation is added to the system to set the selected input to its controlling value and, if a solution exists, then that xheadline is satisfied. If an xheadline cannot be satisfied in step 1401, then a "failure" is returned. Such failed xheadlines must be satisfied by the current seed (thus, this process is a deterministic method of satisfying AND/OR xheadlines). In contrast, any failed xheadlines identified in step 1402 can wait to be satisfied by a future seed covering a later shift cycle. However, step 1402 can attempt to satisfy xheadlines for "free" using the current PRPG seed. This process can be characterized as an opportunistic justification of xheadline inputs, which can advantageously satisfy a significant number of xheadlines using "free" bits.

The pseudo code below can implement steps 1401 and 1402:

```
for all AND/OR headlines with highest input in shift window
    for all inputs i
        add equation setting input i to controlling value
        solve system of equations
        if (success) break
    end
    if not solved and no more inputs, return fail
end
for all other AND/OR headlines
    for all inputs i
        add equation setting input i to controlling value
        solve system of equations
        if (success) break
    end
end
return success
```

Referring back to FIG. 13, if technique 1400 (FIG. 14) fails to satisfy all required xheadlines in step 1309, then step 1310 can reduce the shift window and return to step 1304 using the new, smaller window. Reducing the window (1310) can be performed incrementally, by fixed or variable steps, or through binary search, which would be known by those skilled in the art. In step 1311, any remaining don't care values are randomly assigned, and the solution of the final system of equations can be translated to a PRPG seed. Additionally, at this time, all xheadlines can be updated, i.e. satisfied xheadlines can be removed and non-controlling inputs set to a value can be removed from other xheadlines. If not all shifts are done, then the process can return to step 1303 as shown by arrow 1312. When all shifts are done, the procedure completes at step 1311.

In summary, as outlined in FIGS. 13 and 14, mapping xheadlines and care bits to PRPG seeds combines solving linear equations (for care bits and XOR headlines) and searching for solutions to non-linear AND/OR headlines. The former is, by nature of linear solvers, complete, i.e. if a solution exists, it will be found. The latter, however, could result in a very large search space. Advantageously, various techniques of mapping AND/OR headlines are provided, all emphasizing run-time efficiency while allowing incompleteness (i.e. not all possible combinations of input assignments are explored).

The above-described delayed justification technique was applied to 23 industrial designs ranging from 0.4 to 7.5 million gates, ordered by increasing size and referenced by number. Tables 1A and 1B indicate the design sizes (second row) in millions of gates, and the number of scan cells (third row) in thousands.

TABLE 1A

Industrial designs, sizes, and number of scan cells

| 1 | 2 | 3 | 4 | 5 | 6 | 7 | 8 | 9 | 10 | 11 | 12 |
|---|---|---|---|---|---|---|---|---|----|----|----|
| 0.4 | 0.8 | 0.7 | 1.0 | 1.1 | 1.1 | 1.1 | 1.4 | 1.4 | 1.4 | 1.5 | 1.7 |
| 22 | 21 | 25 | 27 | 21 | 50 | 43 | 41 | 54 | 50 | 34 | 77 |

TABLE 1B

Industrial designs, sizes, and number of scan cells

| 13 | 14 | 15 | 16 | 17 | 18 | 19 | 20 | 21 | 22 | 23 |
|----|----|----|----|----|----|----|----|----|----|----|
| 1.8 | 1.8 | 2.4 | 2.5 | 2.7 | 3.2 | 3.6 | 3.8 | 4.0 | 7.0 | 7.5 |
| 57 | 55 | 102 | 103 | 76 | 105 | 135 | 118 | 117 | 261 | 232 |

Using scan test system 100 shown in FIG. 1, ATPG was run three times on each design. Run 1 was an uncompressed, optimized scan ATPG with dynamic compaction (wherein run 1 was used as a reference for test coverage, data volume and cycles count). MUXes inserted on the internal chains allowed reconfiguration into fewer and longer chains in this run. Run 2 was a compressed, optimized ATPG with no xheadlines. Run 3 was a compressed, optimized ATPG with xheadlines and delayed justification, as described above.

The stuck-at fault model, which is well known to those skilled in test generation, was used for all runs because patterns generated for stuck-at faults generally have higher care bits density than patterns for other fault models, and it is precisely the high care bits density that the delay justification technique addresses. Note that faults on compressor logic and reconfiguration MUXes were excluded from all runs, so that scan (run 1) and the two compressed runs (runs 2 and 3) work on exactly the same fault list. The same core ATPG was used for all runs, with the same abort limit, merge effort, etc. For all designs, the test coverage obtained by the three runs was the same, within a few hundredths of a percent that are due to random effects. Notably, the random variations did not show a bias towards any one run.

Figure 15A:
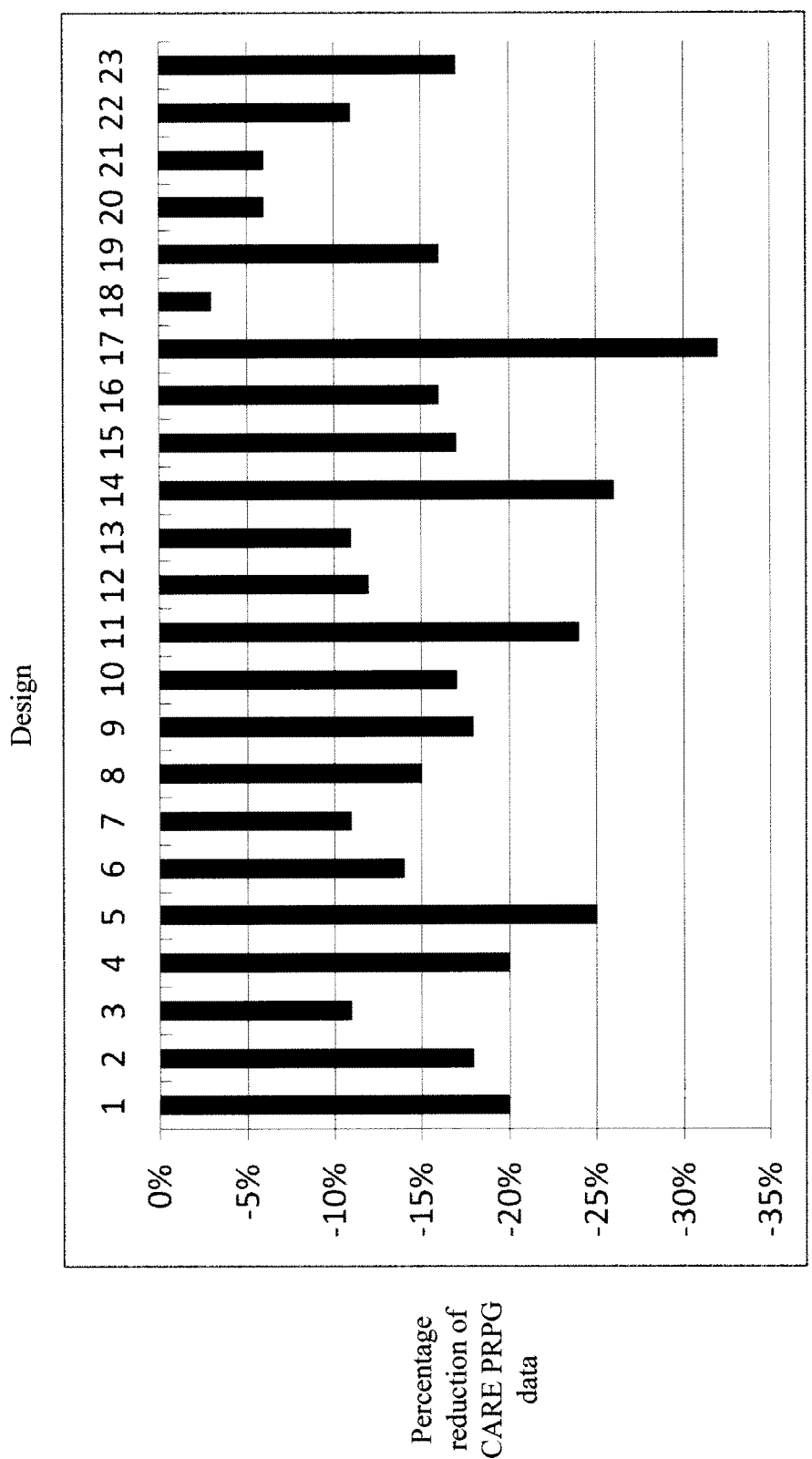
FIGS. 15A-15E illustrate ATPG results for various integrated circuit designs using the delayed justification technique.

As shown by FIGS. 15A-15E (described below), the delayed justification technique enables more efficient mapping of conditions necessary for fault detection (care bits and headlines) into CARE PRPG seeds. The reduction in total CARE PRPG data is shown in FIG. 15A, which compares results from runs 2 and 3. The average reduction of CARE PRPG data (y axis) is 16%, with 8 designs around or above 20%. This is a significant reduction on an optimized ATPG flow using very efficient mapping to PRPG seeds. The designs with the lowest reduction (18, 20 and 21) are those where the delayed justification technique finds relatively xfew headlines.

The real measure of a compression method, however, is how it compares to scan results. A consistent reduction in CARE PRPG data is shown, but total data volume also includes XTOL PRPG data and MISR unloads. The set of 23 industrial designs was selected to represent challenging compression benchmarks as they have a significant number of Xs. A low X-density is reflected in less than 10% XTOL seeds vs. total number of seeds—only four designs (1, 5, 7 and 22) have low X-densities, eight designs (2, 3, 4, 8, 9, 10, 12 and 15) have medium X-densities (i.e. 10%-30% XTOL seeds), and the other 11 designs have high X-densities (i.e. over 30% XTOL seeds). The delayed justification technique described above can reduce CARE PRPG data, but blocking all Xs from entering the MISR can require additional XTOL PRPG data.

Figure 15B:
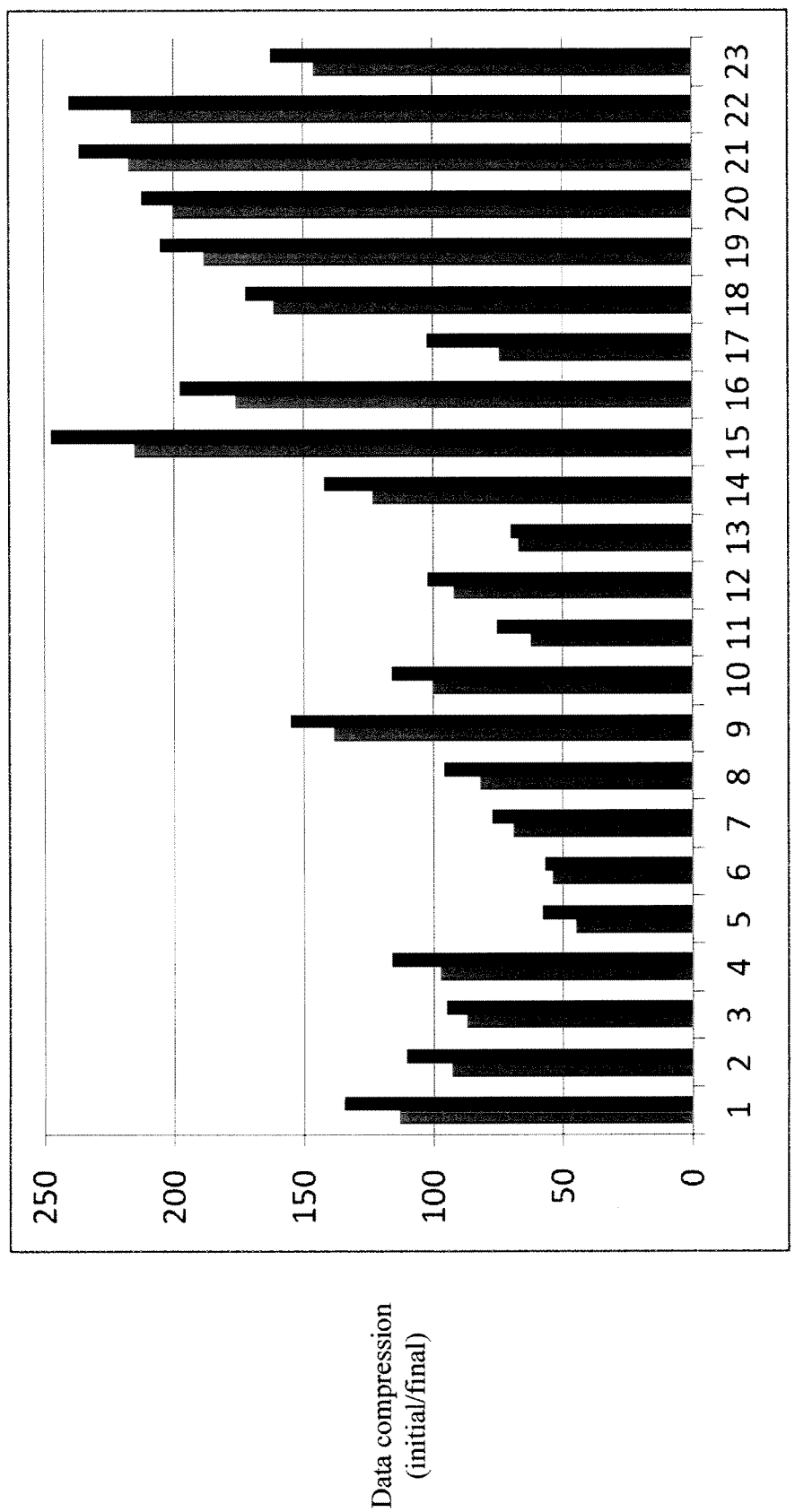

The total data compression computed as the ratio of total data volume vs. scan is shown in FIG. 15B. For each design, the left bar shows the initial compression (data volume run 2/data volume run 1), and the right bar the final compression (data volume run 3/data volume run 1). Note that for all designs, compression increases when the delayed justification technique is applied. The designs previously noted to have the lowest CARE PRPG reduction (18, 20 and 21) turn out to have an already high compression in run 2 (in the 200× range), which is even higher in run 3. The reason for the significant compression improvement, even for designs with high XTOL seed volume, is that the delayed justification technique can reduce pattern count and thus, indirectly, XTOL seeds.

Figure 15C:
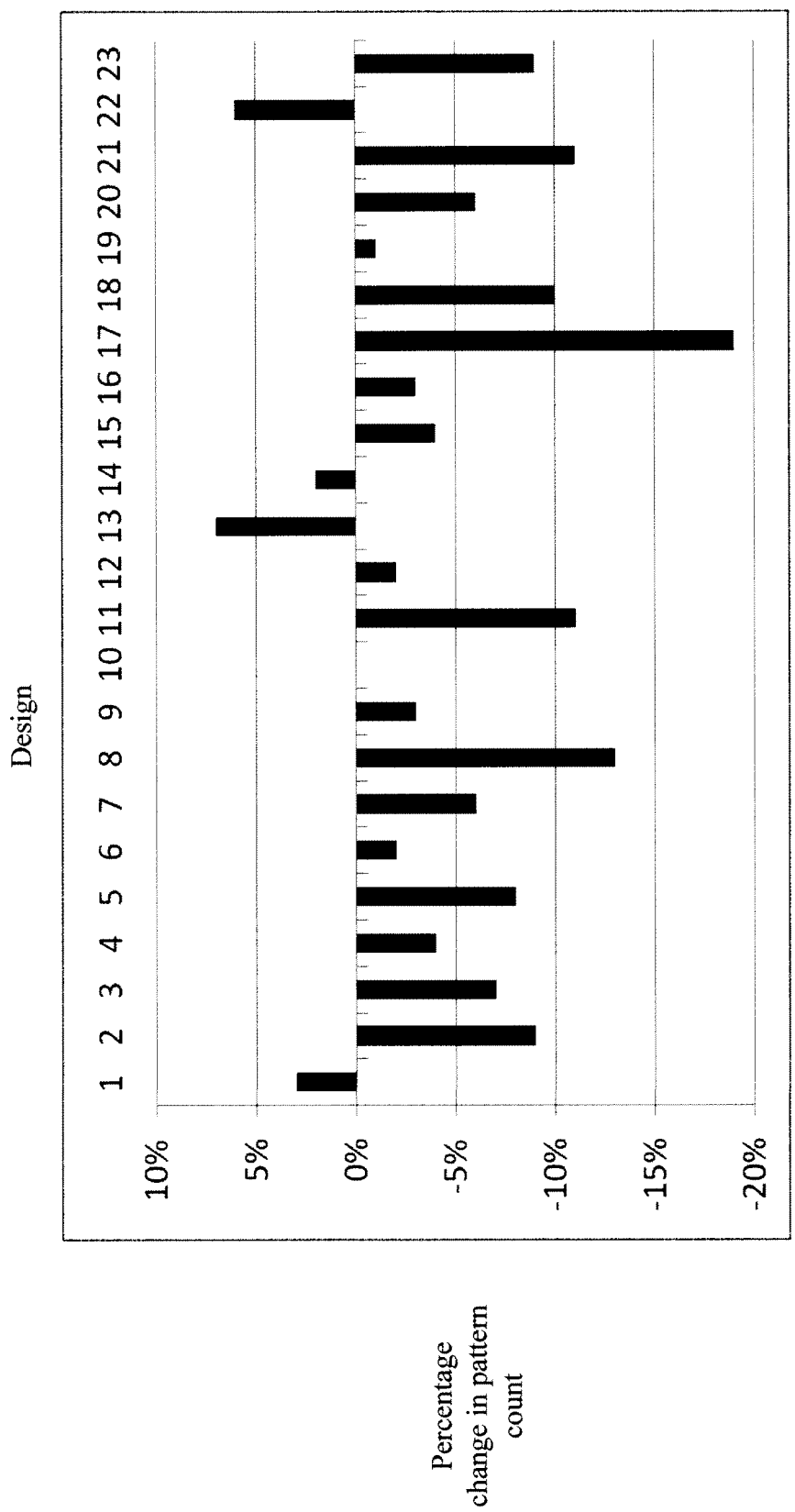

FIG. 15C shows the percentage change in pattern count comparing runs 2 and 3. A negative percentage change shows a reduction. Thus, the delayed justification technique can provide significant reduction in pattern count up to 18% with an average pattern count reduction of approximately 5%.

Figure 15D:
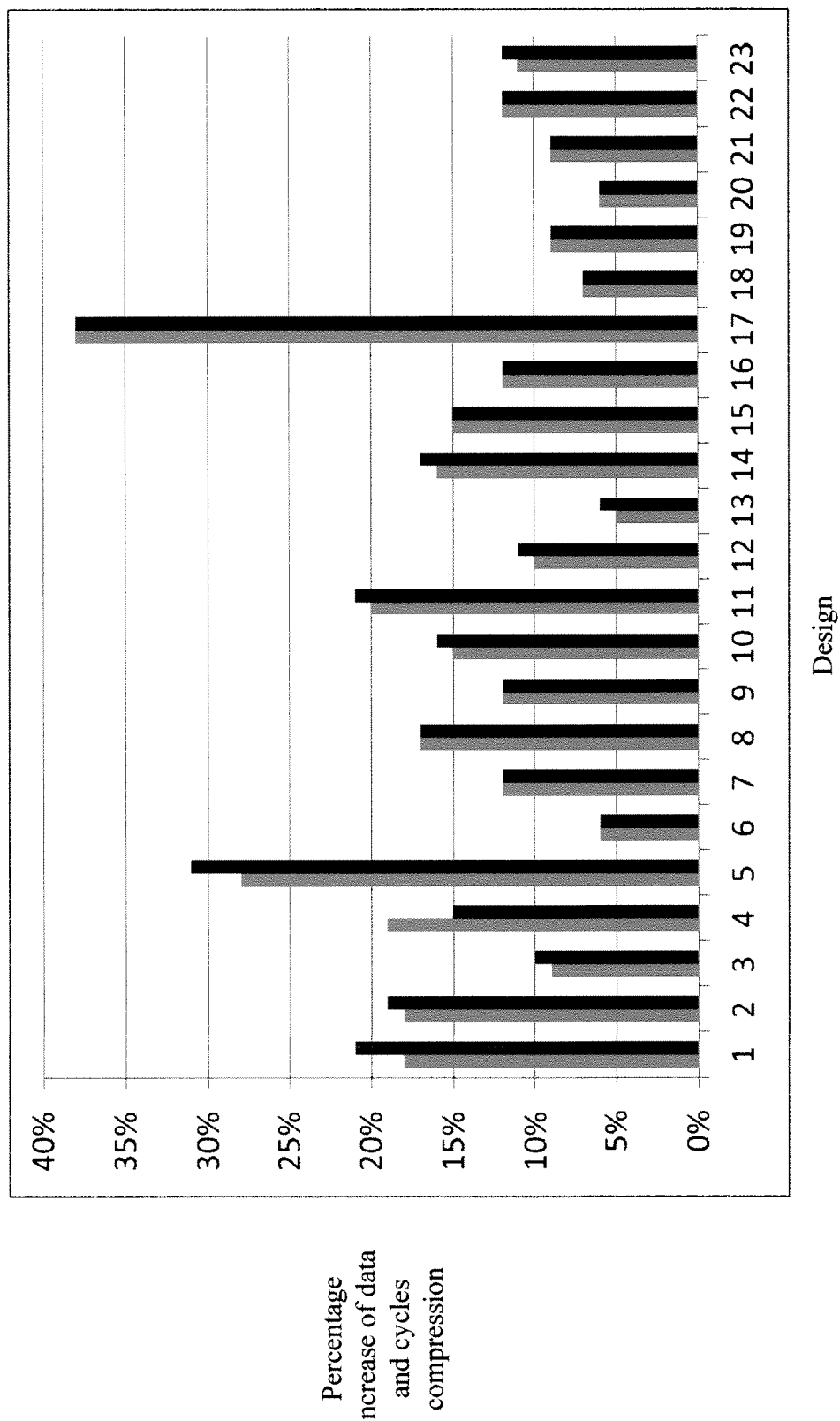

Arguably harder than improving data compression is improving cycles compression, because these two goals often have conflicting requirements. For instance, using fewer seeds can reduce compressed data volume and thus increase data compression, but can also result in more patterns, and thus more cycles and decreased cycles compression. FIG. 15D shows, for each design, the relative improvement achieved with the delayed justification technique on data compression (left bar) and cycles compression (right bar) (i.e. the relative improvement from run 2/run 1 to run 3/run 1).

Note that data and cycles compression improves for all designs. Moreover, for most designs, data and cycles compression have very similar values, thereby underscoring the consistency and efficiency of the delayed justification technique.

Figure 15E:
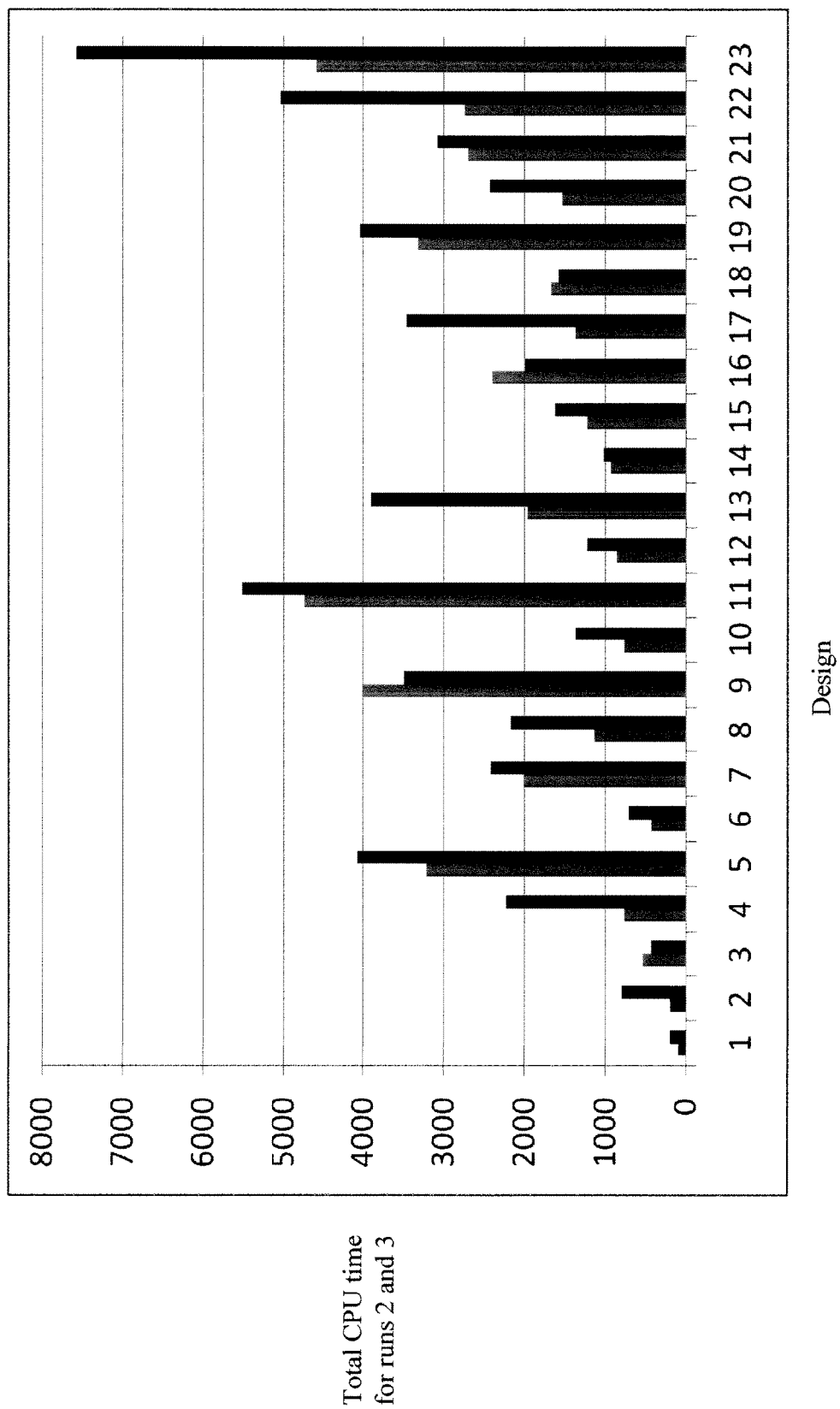

The delayed justification technique performs additional steps compared to the conventional FAN algorithm. These additional steps include dynamically identifying xheadlines and ensuring their satisfiability during test generation, transforming and augmenting xheadlines, and mapping all xheadlines and care bits to PRPG seeds. These added operations can result in increased total CPU time, wherein 95% or more of the increase is attributed to checking xheadlines satisfiability after each successful test generation. Hundreds or even thousands of xheadlines are checked for every one of hundred or even thousands targeted faults every pattern. As shown in FIG. 15E, for designs where a large number of xheadlines are identified, CPU time can double. In contrast, CPU time can decrease for designs with relatively few xheadlines due to their reduced pattern count. As shown in FIG. 15E, an average increase in CPU time is approximately 20%.

The delayed justification technique described above does not affect test coverage or diagnosis, as it simply increases the efficiency of mapping conditions necessary for fault detection into PRPG seeds. Additionally, the delayed justification technique requires no hardware changes. Indeed, this technique can be used with any linear decompressor.

Figure 16:
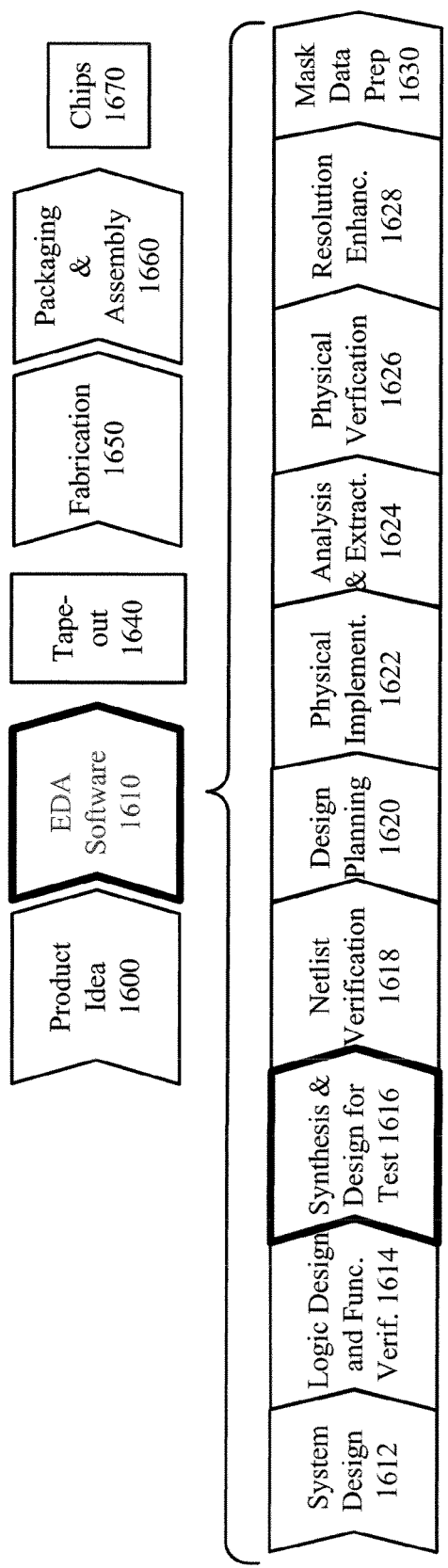
FIG. 16 shows a simplified representation of an exemplary digital ASIC design flow.

FIG. 16 shows a simplified representation of an exemplary digital ASIC design flow including the above-described delayed justification technique. At a high level, the process starts with the product idea (step 1600) and is realized in an EDA software design process (step 1610). When the design is finalized, it can be taped-out (event 1640). After tape out, the fabrication process (step 1650) and packaging and assembly processes (step 1660) occur resulting, ultimately, in finished chips (result 1670).

The EDA software design process (step 1610) is actually composed of a number of steps 1612-1630, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 1610) will now be provided:

System design (step 1612): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 1614): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 1616): Here, the VHDL/ Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, DFTMAX, TetraMAX, and DesignWare® products. In one embodiment, the above-described delayed justification technique can be implemented in step 1616.

Netlist verification (step 1618): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 1620): Here, an overall floorplan for the chip is constructed and analyzed for timing and top-level routing. Exemplary EDA software products from Synopsys, Inc. that can be used at this step include Astro and IC Compiler products.

Physical implementation (step 1622): The placement (positioning of circuit elements) and routing (connection of the same) occurs at this step. Exemplary EDA software products from Synopsys, Inc. that can be used at this step include the Astro and IC Compiler products.

Analysis and extraction (step 1624): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 1626): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 1628): This step involves geometric manipulations of the layout to improve manufacturability of the design. Exemplary EDA software products from Synopsys, Inc. that can be used at this step include Proteus, ProteusAF, and PSMGen products.

Mask data preparation (step 1630): This step provides the "tape-out" data for production of masks for lithographic use to produce finished chips. Exemplary EDA software products from Synopsys, Inc. that can be used at this step include the CATS® family of products.

The invention can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

The embodiments described herein are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of generating a pseudo-random pattern generator (PRPG) set of bits to increase scan compression, the method comprising:
generating xheadlines for a circuit design, the xheadlines being decision nodes resulting from at least one of gate modification restrictions, dynamic value considerations, and fanout allowance; and
mapping the xheadlines and any care bits, which are generated for non-xheadlines, to the PRPG set of bits,
wherein the gate modification restrictions include limiting the xheadlines to AND, OR, and XOR logic networks or their inverted versions.

2. The method of claim 1, wherein the dynamic value considerations include identifying the xheadlines dynamically based on current values already justified during test generation.

3. The method of claim 1, wherein the fanout allowance includes allowing fanout in a fanin cone of a xheadline.

4. The method of claim 1, further including preprocessing the xheadlines, wherein the preprocessing includes transforming XOR xheadlines having shared inputs.

5. The method of claim 4, wherein the transforming the XOR xheadlines includes creating a system of linear equations and performing Gaussian elimination on the system of linear equations.

6. The method of claim 1, further including preprocessing the xheadlines, wherein the preprocessing includes reducing AND or OR xheadlines with common inputs.

7. The method of claim 6, wherein the reducing AND or OR xheadlines includes providing a first counter and a second counter for each input, the first counter representing a controlling value of "0" and the second counter representing a controlling value of "1".

8. The method of claim 7, wherein the reducing AND or OR xheadlines further includes:
setting values of the first and second counters based on number of shared inputs;
determining an input with a highest counter value;
when the highest counter value exceeds a threshold, setting that input to its corresponding controlling value, which is an assigned value, eliminating certain xheadlines based on values of their inputs, and generating a new 1-input xheadline representing the assigned value.

9. The method of claim 1, wherein the mapping includes sorting of care bits by shift position to enable incremental computation of the PRPG set of bits.

10. The method of claim 9, wherein the mapping further includes estimating xheadline bits per shift.

11. The method of claim 10, wherein the mapping further includes computing a window of shifts using sorted care bits and estimated xheadline bits.

12. The method of claim 11, wherein the mapping further includes setting up linear equations for care bits in the window.

13. The method of claim 12, wherein the mapping further includes setting up linear equations for XOR and 1-input AND/OR xheadlines with highest input in the window.

14. The method of claim 13, wherein the mapping further includes solving the linear equations for care bits as well as XOR and 1-input AND/OR xheadlines, leaving don't care bits unassigned.

15. The method of claim 14, wherein the mapping further includes reducing size of the window when the solving fails and then repeating the setting up and solving equations for the care bits as well as the XOR and 1-input AND/OR xheadlines.

16. The method of claim 15, wherein the mapping further includes adding extra xheadline equations when the solving is successful, the adding including:
   determining which xheadlines are satisfied by a current seed;
   determining which xheadlines can be satisfied by a future seed; and
   determining which xheadlines can opportunistically be satisfied by the current seed.

17. A method of generating a pseudo-random pattern generator (PRPG) set of bits to increase scan compression, the method comprising:
   generating xheadlines for a circuit design, the xheadlines being decision nodes resulting from at least one of gate modification restrictions, dynamic value considerations, and fanout allowance; and
   mapping the xheadlines and any care bits, which are generated for non-xheadlines, to the PRPG set of bits, further including preprocessing the xheadlines, wherein the preprocessing includes augmenting AND or OR xheadlines.

18. The method of claim 17, wherein the augmenting includes determining a highest shift cycle input, and creating subsets of xheadlines sharing the highest shift cycle input, the subsets being disjoint.

19. The method of claim 18, wherein the augmenting further includes adding terms based on type of xheadline to ensure that all xheadlines in a subset are satisfied whether the highest shift cycle input is set to 0 or 1.

20. The method of claim 19, wherein the augmenting further includes transforming each disjointion into a conjunction, wherein each term of the conjunction is a new generated xheadline.

21. The method of claim 20, wherein the augmenting further includes computing an incremental solution based on the conjunction.

22. The method of claim 21, wherein the augmenting further includes repeatedly checking for newly generated shared inputs.

\* \* \* \* \*